United States Patent
Nguyen et al.

(10) Patent No.: US 7,851,976 B2
(45) Date of Patent: Dec. 14, 2010

(54) MICRO MOVABLE DEVICE AND METHOD OF MAKING THE SAME USING WET ETCHING

(75) Inventors: Anh Tuan Nguyen, Kawasaki (JP); Tadashi Nakatani, Kawasaki (JP); Takeaki Shimanouchi, Kawasaki (JP); Masahiko Imai, Kawasaki (JP); Satoshi Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/436,178

(22) Filed: May 6, 2009

(65) Prior Publication Data

US 2009/0212664 A1    Aug. 27, 2009

Related U.S. Application Data

(62) Division of application No. 11/376,114, filed on Mar. 16, 2006, now Pat. No. 7,540,968.

(30) Foreign Application Priority Data

Mar. 18, 2005   (JP) .............................. 2005-079116

(51) Int. Cl.
   *H01L 41/04* (2006.01)
   *H01L 41/047* (2006.01)
(52) U.S. Cl. ...................... 310/328; 310/330
(58) Field of Classification Search ................ 310/324, 310/328, 330–332; 200/181
   See application file for complete search history.

(56) References Cited

U.S. PATENT DOCUMENTS

| | | | |
|---|---|---|---|
| 3,360,664 A * | 12/1967 | Straube ...................... | 310/330 |
| 4,641,153 A * | 2/1987 | Cruz-Uribe .................. | 347/68 |
| 5,437,739 A | 8/1995 | Hays | |
| 5,525,544 A | 6/1996 | Kariyazono et al. | |
| 5,578,976 A | 11/1996 | Yao | |

(Continued)

FOREIGN PATENT DOCUMENTS

JP    52-079654    4/1977

(Continued)

OTHER PUBLICATIONS

USPTO, (Alanko) Non-Final Rejection, Jun. 12, 2008, in parent (section 121 priority) U.S. Appl. No. 11/376,114 [now issued].

(Continued)

*Primary Examiner*—Walter Benson
*Assistant Examiner*—Derek J Rosenau
(74) *Attorney, Agent, or Firm*—Fujitsu Patent Center

(57) ABSTRACT

A micro movable device includes a base substrate, a fixed portion bonded to the base substrate, a movable portion having a fixed end connected to the fixed portion and extending along the base substrate, and a piezoelectric drive provided on the movable portion and the fixed portion on a side opposite to the base substrate. The piezoelectric drive has a laminate structure provided by a first electrode film contacting the movable portion and the fixed portion, a second electrode film and a piezoelectric film between the first and the second electrode films. At least one of the movable portion and the fixed portion is provided with a groove extending along the piezoelectric drive.

6 Claims, 26 Drawing Sheets

U.S. PATENT DOCUMENTS

| | | |
|---|---|---|
| 6,307,452 B1 | 10/2001 | Sun |
| 6,584,660 B1 | 7/2003 | Shimogawa et al. |
| 6,635,519 B2 | 10/2003 | Barber et al. |
| 7,388,319 B2 * | 6/2008 | Bibl et al. .................. 310/331 |
| 7,459,827 B2 * | 12/2008 | Kawakubo et al. ......... 310/309 |
| 2002/0046985 A1 | 4/2002 | Daneman et al. |
| 2002/0189062 A1 | 12/2002 | Lin et al. |
| 2003/0224551 A1 | 12/2003 | Kim et al. |
| 2005/0205514 A1 | 9/2005 | Wu et al. |
| 2005/0210988 A1 | 9/2005 | Amano et al. |
| 2006/0119221 A1 * | 6/2006 | Ikeda et al. ................ 310/332 |
| 2006/0119227 A1 * | 6/2006 | Ikehashi .................... 310/348 |
| 2006/0227489 A1 * | 10/2006 | Bunyan et al. .............. 361/160 |
| 2007/0206300 A1 | 9/2007 | Tanaka |
| 2008/0074472 A1 | 3/2008 | Takahashi |

FOREIGN PATENT DOCUMENTS

| | | |
|---|---|---|
| JP | 07-074246 | 3/1995 |
| JP | 07-312361 | 11/1995 |
| JP | 09-017300 | 1/1997 |
| JP | 2001-143595 | 5/2001 |
| JP | 2002-043273 | 2/2002 |
| JP | 2002-246363 | 8/2002 |
| JP | 2007-504608 | 3/2007 |
| WO | WO2005/022575 | 3/2005 |

OTHER PUBLICATIONS

USPTO, (Rosenau) Restriction Requirement, Dec. 26, 2007, in parent (section 121 priority) U.S. Appl. No. 11/376,114 [now issued].

USPTO, (Alanko) Notice of Allowance, Apr. 27, 2009, in parent (section 121 priority) U.S. Appl. No. 11/376,114 [now issued].

* cited by examiner

FIG.20
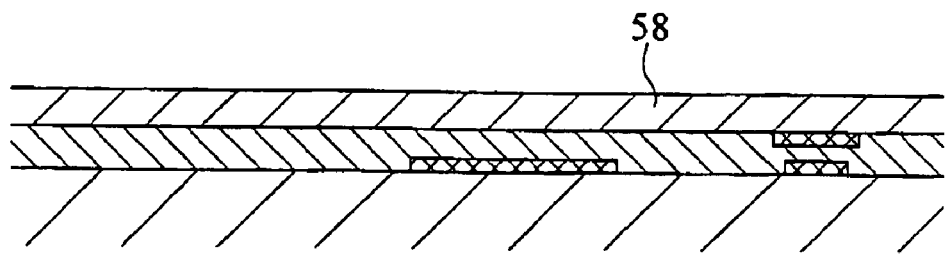
(a)
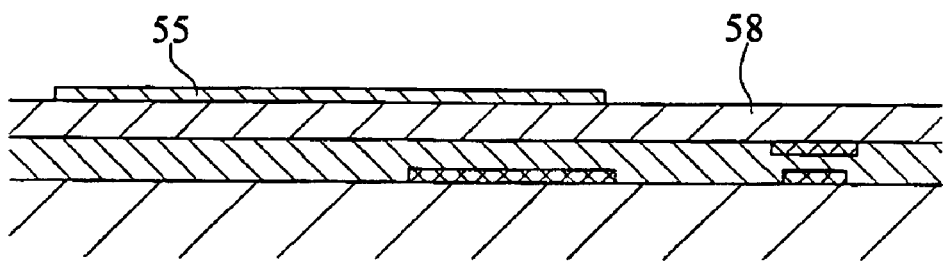
(b)
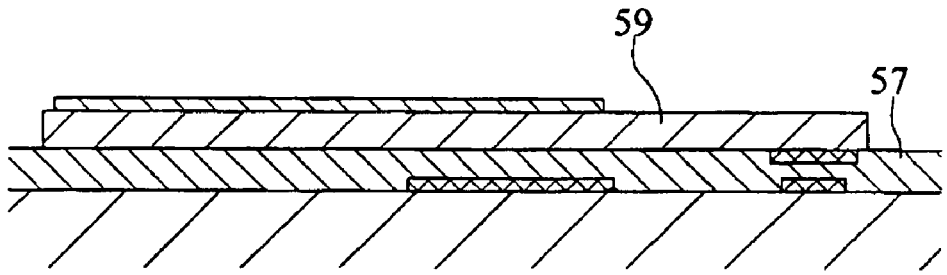
(c)
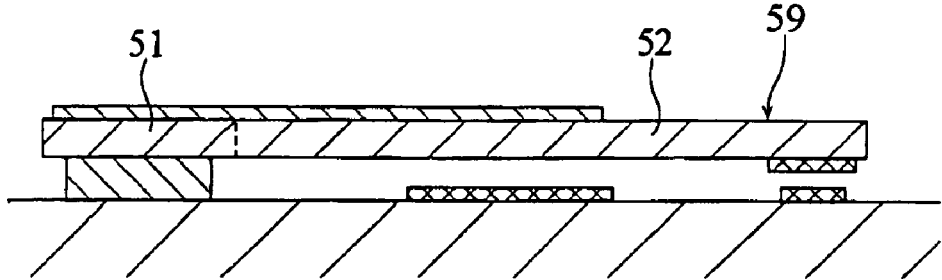
(d)

MICRO MOVABLE DEVICE AND METHOD OF MAKING THE SAME USING WET ETCHING

CROSS-REFERENCE TO RELATED APPLICATION

This application is a Divisional application of currently-pending parent application Ser. No. 11/376,114, filed Mar. 16, 2006, which is based upon and claims the benefits of priority from the prior Japanese Patent Application No. 2005-079116 filed on Mar. 18, 2005. The entire contents of the aforementioned parent and Japanese priority applications are incorporated herein by reference.

BACKGROUND OF THE INVENTION

1. Field of the Invention

The present invention generally relates to micro movable devices and to methods of making the same, in particular, methods using wet etching technique.

2. Description of the Related Art

In the technical field of radio communications equipment such as mobile phones, there is an increasing requirement for smaller high-frequency circuit or RF circuit due to increase in the number of incorporated parts for advanced features. In response to such a requirement, a variety of parts needed for building circuitry are a focus of miniaturization using technologies called MEMS (micro-electromechanical systems).

One of these part categories is MEMS switches. MEMS switches are switching devices having a minute structure manufactured by means of MEMS technology, and include at least a pair of contacts for mechanical opening/closing operations to achieve switching, a drive mechanism for achieving the mechanical opening/closing operations of the contact pair and so on. As compared to other switching devices provided by a PIN diode, an MESFET and so on, MEMS switches tend to exhibit higher isolation when the switch is open, and low insertion loss when the switch is closed because MEMS switch contacts are mechanically opened when the switch is in the open state, and mechanical switches are not susceptible to a large parasitic capacitance. MEMS switches are disclosed in the following Patent Document 1 and Patent Document 2 for example.

Patent Document 1: JP-A-H9-17300

Patent Document 2: JP-A-2001-143595

FIG. 17 and FIG. 18 show a micro switching device X2 which is a conventional MEMS switch. FIG. 17 is a partial plan view of the micro switching device X2 whereas FIG. 18 is a sectional view taken in lines XVIII-XVIII in FIG. 17. The micro switching device X2 includes a substrate S2, a fixed portion 51, a movable portion 52, a movable contact 53, a pair of fixed contact electrodes 54, and drive electrodes 55, 56. The fixed portion 51 is bonded to the substrate S2. The movable portion 52 extends from the fixed portion 51 along the substrate S2. The movable contact 53 is provided in the movable portion 52, on a side facing the substrate S2. The drive electrode 55 is provided on the fixed portion 51 and the movable portion 52. The fixed contact electrodes 54 are patterned on the substrate S2 so that an end of each electrode faces the movable contact 53. The drive electrode 56 is provided on the substrate S2 correspondingly to the drive electrode 55, and is grounded. Also on the substrate S2 is a predetermined wiring pattern (not illustrated) which is electrically connected with the fixed contact electrodes 54 or the drive electrode 56.

In the micro switching device X2 having such a structure as the above, when a predetermined electric potential is applied to the drive electrode 55, an electrostatic pull is generated between the drive electrodes 55, 56. As a result, the movable portion 52 is deformed elastically until the movable contact 53 makes contact with the fixed contact electrodes 54, bringing the micro switching device X2 into a closed state. In the closed state, the movable contact 53 electrically bridges the pair of fixed contact electrodes 54, allowing an electric current to pass through the pair of fixed contact electrodes 54.

On the other hand, if the electrostatic pull acting between the drive electrodes 55, 56 is ceased when the micro switching device X2 is in the closed state, the movable portion 52 returns to its natural state, allowing the movable contact 53 to come away from the fixed contact electrodes 54. Thus, as shown in FIG. 18, the micro switching device X2 is brought to an open state. In the open state, the fixed contact electrodes 54 are electrically disconnected from each other, so no electric current can pass through the pair of fixed contact electrodes 54.

FIG. 19 and FIG. 20 show a method of making the micro switching device X2. In the manufacture of the micro switching device X2, first, as shown in FIG. 19(a), fixed contact electrodes 54 and a drive electrode 56 are patterned on a substrate S2. Specifically, a film of predetermined conductive material is formed on the substrate S2, then a predetermined resist pattern is formed on the conductive film by means of photolithography, and an etching process is performed to the conductive film using the resist pattern as a mask. Next, as shown in FIG. 19(b), a sacrifice layer 57 is formed. Specifically, a sputtering method is used for example, to deposit or grow a predetermined material on the substrate S2 while covering the fixed contact electrodes 54 and the drive electrode 56. Next, an etching process is performed using a predetermined mask, to form a recess 57a in the sacrifice layer 57 as shown in FIG. 19(c), correspondingly to the fixed contact electrodes 54. Next, a film of a predetermined material is formed in the recess 57a, whereby a movable contact 53 is formed as shown in FIG. 19(d).

Next, as shown in FIG. 20(a), a structural film 58 is formed by e.g. sputtering method. Next, as shown in FIG. 20(b), a drive electrode 55 is patterned on the structural film 58. Specifically, a film of a predetermined conductive material is formed on the structural film 58, then a photolithographic method is used to form a predetermined resist pattern on the conductive film, and an etching process is performed to the conductive film using the resist pattern as a mask. Next, as shown in FIG. 20(c), the structural film 58 is patterned to form a film piece 59 which contains part of the fixed portion 51 and the movable portion 52. Specifically, a photolithographic method is used to form a predetermined resist pattern on the structural film 58, and then and an etching process is performed to the structural film 58, using the resist pattern as a mask. Next, as shown in FIG. 20(d), a fixed portion 51 and a movable portion 52 are formed. Specifically, a wet etching process is performed to the sacrifice layer 57 to form an undercut below the movable portion 52 while leaving part of the sacrifice layer 57 as part of the fixed portion 51, using the film piece 59 as an etching mask.

One of the characteristics generally required of switching devices is a low insertion loss in the closed state. In order to lower the insertion loss in switching devices, a pair of fixed contact electrodes should have a low electric resistance.

However, according to the micro switching device X2, it is difficult to make thick contact electrodes 54. Realistically, the thickness of the fixed contact electrodes 54 is up to 2 μm at the best because in the manufacturing process of the micro switching device X2, it is necessary to make sure that the sacrifice layer 57 has a certain level of flatness on its upper surface as in the figure (growing surface).

As was described with reference to FIG. 19(b), the sacrifice layer 57 is formed when a predetermined material deposits or grows on the substrate S2 while covering a pair of fixed contact electrodes 54. Therefore, the growing surface of the sacrifice layer 57 will have steps (not illustrated) following the thickness of the fixed contact electrodes 54. The steps will become more bumpy as the fixed contact electrodes 54 is thicker, and as the steps become more bumpy, it becomes more difficult to form the movable contact 53 at an appropriate location, to form the movable portion 52 into an appropriate shape, and so on. Further, if the fixed contact electrodes 54 are thicker than a certain limit, there can be a case in which the sacrifice layer 57 formed on top of the substrate S2 is cracked due to the thickness of the fixed contact electrodes 54. If the sacrifice layer 57 is damaged, it becomes impossible to form a movable contact 53 and/or a movable portion 52 appropriately on the sacrifice layer 57. Therefore, it is necessary in the micro switching device X2 that the fixed contact electrodes 54 are formed thinly enough so that there is no undesirable step on the growing surface of the sacrifice layer 57. Thus, in the micro switching device X2, it is sometimes difficult to render the fixed contact electrodes 54 a sufficiently low resistance, and as a result, it is sometimes impossible to achieve a low insertion loss.

FIG. 21 through FIG. 25 show a micro switching device X3 which is essentially disclosed in a Japanese Patent Application (No. 2005-023388) filed earlier by the applicant of the present invention. The micro switching device X3 relates to an invention aimed at providing a micro switching device suitable for lowering the insertion loss and adequate for manufacture. The earlier application which makes disclosure essentially of the micro switching device X3 was not public before the present application was filed. FIG. 21 is a plan view of the micro switching device X3 whereas FIG. 22 is a partially non-illustrated plan view of the micro switching device X3. FIG. 23 through FIG. 25 are sectional views taken in lines XXIII-XXIII, XXIV-XXIV, and XXV-XXV respectively in FIG. 21.

The micro switching device X3 includes a base substrate S3, a fixed portion 61, a movable portion 62, a movable contact 63, a pair of fixed contact electrodes 64 (not illustrated in FIG. 22), and a piezoelectric drive 65.

As shown in FIG. 23 through FIG. 25, the fixed portion 61 is bonded to the base substrate S3 via a border layer 61'. The fixed portion 61 is made of silicon material such as monocrystal silicon. The border layer 61' is made of silicon oxide. As shown in FIG. 22 for example, the movable portion 62, has a fixed end 62a fixed to the fixed portion 61, and extends along the base substrate S3 as shown in FIG. 25, and is surrounded by the fixed portion 61, via a slit 66. The movable portion 62 has a body 62A and a head 62B. The movable portion 62 is made of silicon material such as monocrystal silicon.

As clearly shown in FIG. 22, the movable contact 63 is provided on the head 62B of the movable portion 62. As shown in FIG. 23 and FIG. 25, each of the fixed contact electrodes 64 is erected on the fixed portion 61, and has a contact region 64a which faces the movable contact 63. Each of the fixed contact electrodes 64 is connected with a predetermined circuit which is served by the switching device, via a predetermined wiring (not illustrated). The movable contact 63 and the fixed contact electrodes 64 are preferably made of a precious metal selected from a group consisting of Au, Pt, Pd and Ru, or an alloy containing the selected precious metal.

The piezoelectric drive 65 includes electrode films 65a, 65b and a piezoelectric film 65c between the two. Each of the electrode films 65a, 65b has a laminate structure provided by e.g. a Ti underlayer and a Pt main layer. The electrode film 65b is grounded via a predetermined wiring (not illustrated). The piezoelectric film 65c is made of a piezoelectric material which is a material distinguished by a nature (inverse piezoelectric effect) that the material is distorted upon application of an electric field. Examples of the usable piezoelectric material include PZT (a solid solution of $PbZrO_3$ and $PbTiO_3$), ZnO doped with Mn, ZnO and AlN. The electrode films 65a, 65b have a thickness of e.g. 0.55 μm, whereas the piezoelectric film 65c has a thickness of e.g. 1.5 μm.

In the micro switching device X3 which has the structure as described above, when a predetermined positive electric potential is applied to the electrode film 65a, an electric field is generated between the electrode film 65a and the electrode film 65b, and a contractive force is generated in the piezoelectric film 65c in its in-plane directions. Shrinkage of the piezoelectric material in the in-plane directions of the piezoelectric film 65c is greater at a place farther away from the electrode film 65a which is supported directly by the movable portion 62, i.e. there is more shrinkage at a place closer to the electrode film 65b. For this reason, the amount of in-plane shrinkage resulting from the above-described contractive force gradually increases from the side closer to the electrode film 65a toward the side closer to the electrode film 65b, within the piezoelectric film 65c, making the movable portion 62 elastically deform to bring the movable contact 63 into contact with the fixed contact electrodes 64 or the contact region 64a. This brings the micro switching device X3 into a closed state. In the closed state, the movable contact 63 bridges the pair of fixed contact electrodes 64, allowing an electric current to pass through the pair of fixed contact electrodes 64. In such a way, it is possible to make an ON state of e.g. a high-frequency signal.

Now, the micro switching device X3 being in the closed state, when the electric field between the electrode film 65a and the electrode film 65b is ceased by stopping the application of the electric potential to the piezoelectric drive 65, the piezoelectric film 65c and the movable portion 62 return to their natural states, allowing the movable contact 63 to come away from the fixed contact electrodes 64. Thus, the micro switching device X3 is brought to an open state. In the open state, the fixed contact electrodes 64 are electrically disconnected from each other, so no electric current can pass through the pair of fixed contact electrodes 64. In this way, it is possible to make an OFF state of the high-frequency signal.

FIG. 26 through FIG. 29 show a method of manufacturing the micro switching device X3. The figures show changes in part of the section taken in lines XXIII-XXIII in FIG. 21, as well as changes in part of the section taken in lines in FIG. 21. In the manufacture of the micro switching device X3, first, a substrate 70 as shown in FIG. 26(a) is prepared. The substrate 70 is an SOI (silicon on insulator) substrate, having a laminate structure provided by a first layer 71, a second layer 72 and a middle layer 73 between the two. As examples, the first layer 71 has a thickness of 10 μm, the second layer 72 has a thickness of 400 μm and the middle layer 73 has a thickness of 2 μm. The first layer 71 is made of e.g. monocrystal silicon, from which the fixed portion 61 and the movable portion 62 as described above are to be formed. The second layer 72 is made of e.g. monocrystal silicon, from which the substrate S3 is to be formed. The middle layer 73 is made of silicon oxide, from which the border layer 61' is to be formed.

Next, as shown in FIG. 26(b), a piezoelectric drive 65 is formed on the first layer 71 of the substrate 70. In forming the piezoelectric drive 65, first, a first conductive film is formed on the first layer 71, for formation of an electrode film 65a. Next, a film of a piezoelectric material is formed on the first conductive film, for formation of a piezoelectric film 65c. Next, a second conductive film is formed on the film of piezoelectric material, for formation of an electrode film 65b. Thereafter, each film is patterned in an etching process using a predetermined mask. The first and the second conductive films as the targets of the patterning can be formed by sputtering method for example, by first forming a film of Ti and then forming a film of Pt thereon. The film of piezoelectric material can be formed by sputtering method for example, by forming a film of a predetermined piezoelectric material.

Next, as shown in FIG. 26(c), a movable contact 63 is formed on the first layer 71. This can be done for example, by first forming a film of Cr on the first layer 71 by sputtering, and then forming thereon a film of Au. Next, a photolithographic method is used to form a predetermined resist pattern on this multi-layered conductive film, and then an etching process is performed to the multi-layered conductive film, using the resist pattern as a mask. In this way, it is possible to pattern the movable contact 63 on the first layer 71.

Next, as shown in FIG. 26(d), a protective film 81 is formed for covering the piezoelectric drive 65. The formation of the protective film 81 can be achieved for example, by forming a film of Si using a sputtering method using a predetermined mask. The piezoelectric drive 65, and particularly the piezoelectric film 65c thereof, tends to be eroded by an etchant which is used in the wet etching process employed for removing a sacrifice layer 82 to be described later and part of the middle layer 73. The protective film 81 is formed to protect the piezoelectric drive 65 or the piezoelectric film 65c from the erosion, and is resistant to the etchant.

Next, as shown in, FIG. 27(a), the first layer 71 is etched to form a slit 66. Specifically, a photolithographic method is used to form a predetermined resist pattern on the first layer 71, and then an etching process is performed to the first layer 71 using the resist pattern as a mask. Through this removal step, the first layer 71 yields a fixed portion 61 and a movable portion 62.

Next, as shown in FIG. 27(b), a sacrifice layer 82 is formed on the substrate 70, on the side formed with the first layer 71, to fill the slit 66. The sacrifice layer can be formed of silicon oxide. The sacrifice layer 82 can be formed by means of plasma CVD method or sputtering method for example. In the present step, the sacrifice layer material deposits on part of side walls of the slit 66 as well, and fills the slit 66.

Next, as shown in FIG. 27(c), two recesses 82a are formed in the sacrifice layer 82, at places corresponding to the movable contact 63. Specifically, a photolithographic method is used to form a predetermined resist pattern on the sacrifice layer 82, and then an etching process is performed to the sacrifice layer 82 using the resist pattern as a mask. The etching can be achieved by means of wet etching. Each of the recesses 82a is for formation of a contact region 64a of the fixed contact electrode 64.

Next, as shown in FIG. 28(a), the sacrifice layer 82 is patterned to form open regions 82b. Specifically, a photolithographic method is used to form a predetermined resist pattern on the sacrifice layer 82, and then an etching process is performed to the sacrifice layer 82 using the resist pattern as a mask. The etching can be achieved by means of wet etching. The exposed open regions 82b are regions the fixed portion 61 which the fixed contact electrodes 64 are bonded to.

Next, in the object structure shown in FIG. 28(c), an undercoating film (not illustrated) which serves as an electric path is formed on the surface provided with the sacrifice layer 82 and then, a resist pattern 83 is formed as shown in FIG. 28(b). The undercoating film can be formed by sputtering method for example, by first forming a film of Cr to a thickness of 50 nm and then forming a film of Au thereon to a thickness of 500 nm. The resist pattern 83 has open regions 83a corresponding to the pair of fixed contact electrodes 64.

Next, as shown in FIG. 28(c), the pair of fixed contact electrodes 64 is formed. Specifically, an electroplating method is used to grow a film of e.g. Au on the undercoating film exposed on the open regions 83a.

Next, as shown in FIG. 29(a), the resist pattern 83 is removed by etching. Thereafter, exposed portions of the undercoating film are removed by etching. These etching processes can be achieved by means of wet etching, each using a predetermined etchant.

Next, as shown in FIG. 29(b), the sacrifice layer 82 and part of the middle layer 73 are removed. Specifically, a wet etching process is performed to the sacrifice layer 82 and the middle layer 73. The etchant can be provided by buffered hydrofluoric acid (BHF). In this etching process, the sacrifice layer 82 is removed first and thereafter, part of the middle layer 73 is removed from places exposed to the slit 66. The etching process ceases when an appropriate gap is formed between the entire movable portion 62 and the second layer 72. FIG. 29(b) shows a gap G, which was formed by the etchant that entered from the slit 66, along the fixed contact electrodes 64 and etched the middle layer 73. In this way, it is possible to etch the middle layer 73 to leave a border layer 61'. Note that the second layer 72 will constitute the base substrate S3.

Next, a wet etching process is performed as necessary, to remove part of the undercoating film (e.g. Cr film) remaining on the bottom surface of the fixed contact electrodes 64, and then the entire device is dried. Thereafter, as shown in FIG. 29(c), the protective film 81 is removed. The removal can be made by e.g. RIE (Reactive Ion Etching) which uses $O_2$ gas as an etching gas.

By following the above-described steps, it is possible to manufacture the micro switching device X3. According to the above-described method, the fixed contact electrodes 64 which have the contact regions 64a faced by the movable contact 63 can be formed thickly on the sacrifice layer 82 by plating method as described with reference to FIG. 28(c). Therefore, it is possible to secure a sufficient thickness for the fixed contact electrodes 64. The micro switching device X3 as the above is suitable for lowering the insertion loss in the closed state. In addition, according to the micro switching device X3, the bottom surface of the contact regions 64a in the fixed contact electrodes 64 (i.e. the surface which can make contact with the movable contact 63) is not a frontier surface where a layer of plated metal grows, and therefore is highly flat. Thus, it is possible to form an air gap between the movable contact 63 and the contact regions 64a at a high dimensional accuracy. The gap which has a high dimensional accuracy is suitable for lowering the insertion loss in the closed state and is suitable for improving isolation characteristics in the open state.

However, according to the above-described method of making the micro switching device X3, there is a case in which the etchant erodes the piezoelectric drive 65 in the step described with reference to FIG. 29(b). Specifically, the wet etching process described with reference to FIG. 29(b) requires a few hours of time. During such a long period of time of the wet etching process, the etchant can gradually make its way along the bonding border surface between the first layer 71 and the protective film 81, and sometimes the etchant reaches the piezoelectric drive 65, in which case the piezoelectric drive 65 (and the piezoelectric film 65c in particular) is eroded by the etchant. The erosion of the piezoelectric drive 65 or the piezoelectric film 65c is undesirable since it prevents the piezoelectric drive 65 from driving the movable portion 62.

SUMMARY OF THE INVENTION

The present invention was made under the above-described circumstances, and it is therefore an object of the present invention to provide a method suitable for performing a wet etching while providing sufficient protection to desired regions, to provide a method of making a micro movable device including a wet etching step suitable for providing sufficient protection to desired regions, and to provide a micro movable device.

A first aspect of the present invention provides a wet etching method. This etching method includes: a step of forming a groove extending along a protection target in an object structure; a step of forming an etchant-resistant protective film on the object structure, covering the protection target and the groove, with part of the film extending into the groove; and a step of etching the object structure with an etchant.

In the step of etching according to the present method where the etchant acts on the object structure, if the etchant happens to come into the bonding surface between the object structure and the etchant-resistant protective film, the etchant cannot have crossed the groove until the etchant has traveled all the way through a non-straight path along the inner surface of the groove as well as a non-straight path along the surface of the etchant-resistant protective film which drops into the groove. Therefore, in the etching step according to the present method, the groove which is formed along the protection target and is covered by the etchant-resistant protective film, and the etchant-resistant protective film which has its part covering down into the groove constitute a structure that works to slow down the etchant which makes its way into the bonding surface between the object structure and the etchant-resistant protective film to approach or reach the protection target. Therefore, the present method is suitable for performing an etching process while providing sufficient protection to the protection target.

A second aspect of the present invention provides a method of making a micro movable device from a material substrate having a laminate structure including a first layer, a second layer and a middle layer between the first and the second layer. The micro movable device includes: a base substrate; a fixed portion bonded to the base substrate; a movable portion having a fixed end fixed to the fixed portion and extending along the base substrate; and a piezoelectric drive provided on the movable portion and the fixed portion on a side away from the base substrate, and having a laminate structure provided by a first electrode film contacting the movable portion and the fixed portion, a second electrode film and a piezoelectric film between the first and the second electrode films. The method includes: a step of forming a piezoelectric drive on the first layer; a groove forming step of forming a groove in the first layer, to extend along the piezoelectric drive by etching the first layer to a midway in a thickness direction of the first layer using a first masking pattern; a protective film forming step of forming an etchant-resistant protective film covering the piezoelectric drive and the groove, with part of the protective film extending into the groove; a step of forming the movable portion and the fixed portion by etching the first layer to expose the middle layer using a second masking pattern; and a step of removing material from the middle layer between the movable portion and the second layer by wet etching.

In the wet etching step according to the present method, if the etchant happens to come into the bonding surface between the movable portion and the etchant-resistant protective film, the etchant cannot have crossed the groove until the etchant has traveled all the way through a non-straight path along the inner surface of the groove as well as a non-straight path along the surface of the etchant-resistant protective film which drops into the groove. Therefore, in the wet etching step according to the present method, the groove which is formed along the piezoelectric drive and is covered by the etchant-resistant protective film, and the etchant-resistant protective film which has its part covering down into the groove constitute a structure that works to slow down the etchant which makes its way into the bonding surface between the movable portion and the etchant-resistant protective film to approach or reach the piezoelectric drive. As described, the present method includes a wet etching step which is suitable for etching while providing sufficient protection to the piezoelectric drive (protection target).

Preferably, a plurality of grooves extending along the piezoelectric drive are formed in the first layer in the groove forming step. The etchant-resistant protective film formed in the protective film forming step covers the piezoelectric drive and the grooves, with part of the protective film extending into each of the grooves. Such an arrangement as the above is suitable for slowing down the etchant which makes its way into the bonding surface between the movable portion and the etchant-resistant protective film to approach or reach the piezoelectric drive.

Preferably, the groove or the grooves surround a region in the first layer contacted by the piezoelectric drive. Such an arrangement as the above is suitable for protecting the piezoelectric drive from the etchant which makes its way into the bonding surface between the movable portion and the etchant-resistant protective film.

Preferably, the groove or the grooves include a corner where the groove or the grooves bend to change direction. The corner has an inner angle which is greater than 90 degrees. If the groove has such corners, these corners exhibit superior ability in slowing down the etchant's crosscutting travel to other corners whose inner angle is smaller than 90 degrees at which the groove makes a sharper bent to change its direction.

Preferably, the etchant-resistant protective film contains polyimide as a main constituent. An etchant-resistant protective film containing polyimide as a main constituent tends to have superb heat resistance as well, and is suitable when the etchant-resistant protective film must be heat resistant.

A third aspect of the present invention provides a micro movable device. The micro movable device includes: a base substrate; a fixed portion bonded to the base substrate; a movable portion having a fixed end fixed to the fixed portion and extending along the base substrate; and a piezoelectric drive provided on the movable portion and the fixed portion on a side away from the base substrate, and having a laminate structure provided by a first electrode film contacting the movable portion and the fixed portion, a second electrode film and a piezoelectric film between the first and the second electrode films. The movable portion and/or the fixed portion is provided with a groove extending along the piezoelectric drive. The present movable device is made by the method according to the second aspect of the present invention.

A micro movable device according to the present invention may further include: a movable contact provided in the movable portion, on a side away from the base substrate; and a pair of fixed contact electrodes, each bonded to the fixed portion and having a portion facing the movable contact. The present micro movable device may be constructed as a micro switching device for selectively achieving a closed state where the movable contact on the movable portion electrically bridges the two fixed contact electrodes, and an open state where the movable contact is spaced from the fixed contact electrodes.

BRIEF DESCRIPTION OF THE DRAWINGS

FIG. 20 shows steps following the steps in FIG. 19.

DETAILED DESCRIPTION OF THE PREFERRED EMBODIMENTS

Figure 1:
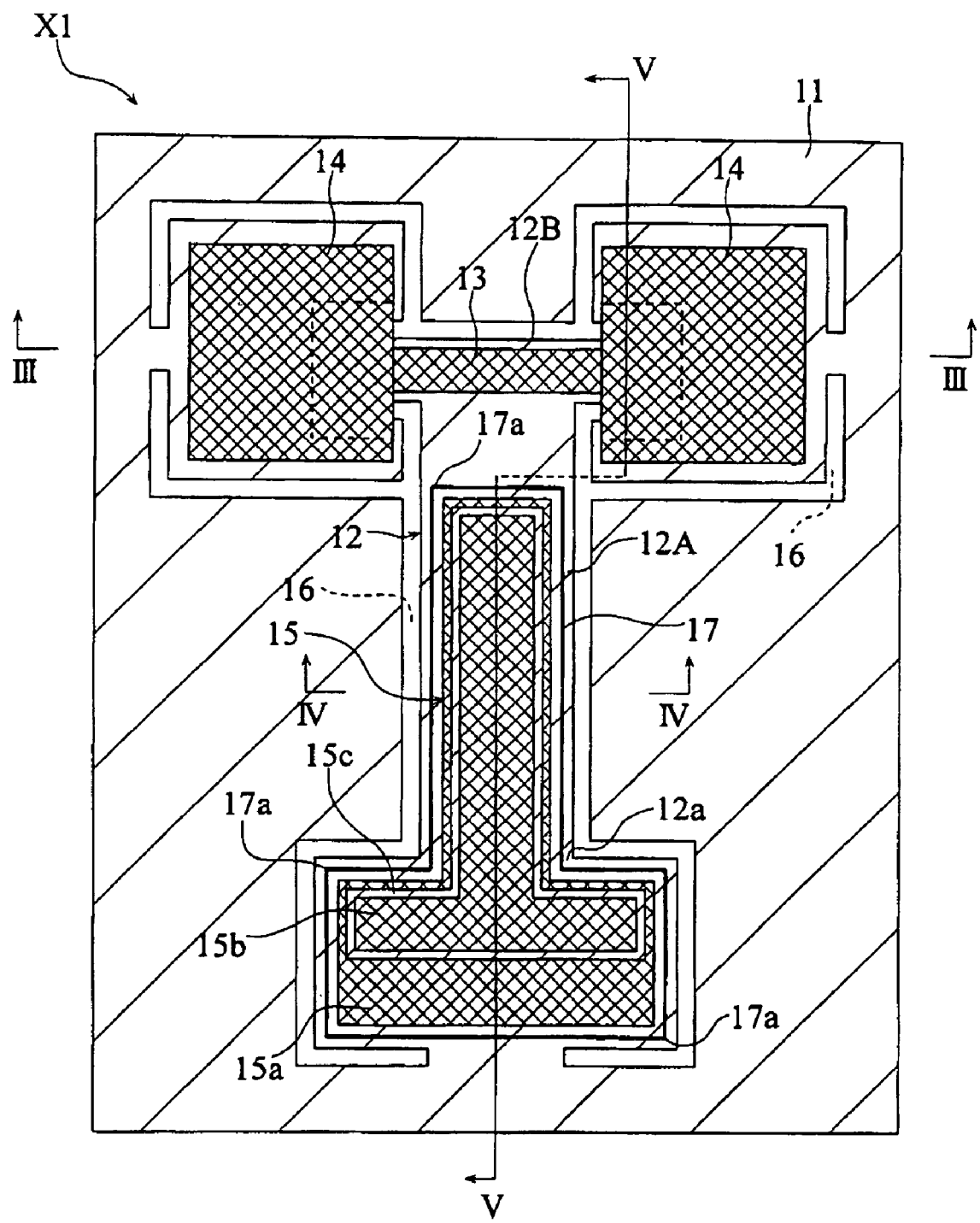
FIG. 1 is a plan view of a micro switching device according to the present invention.
Figure 2:
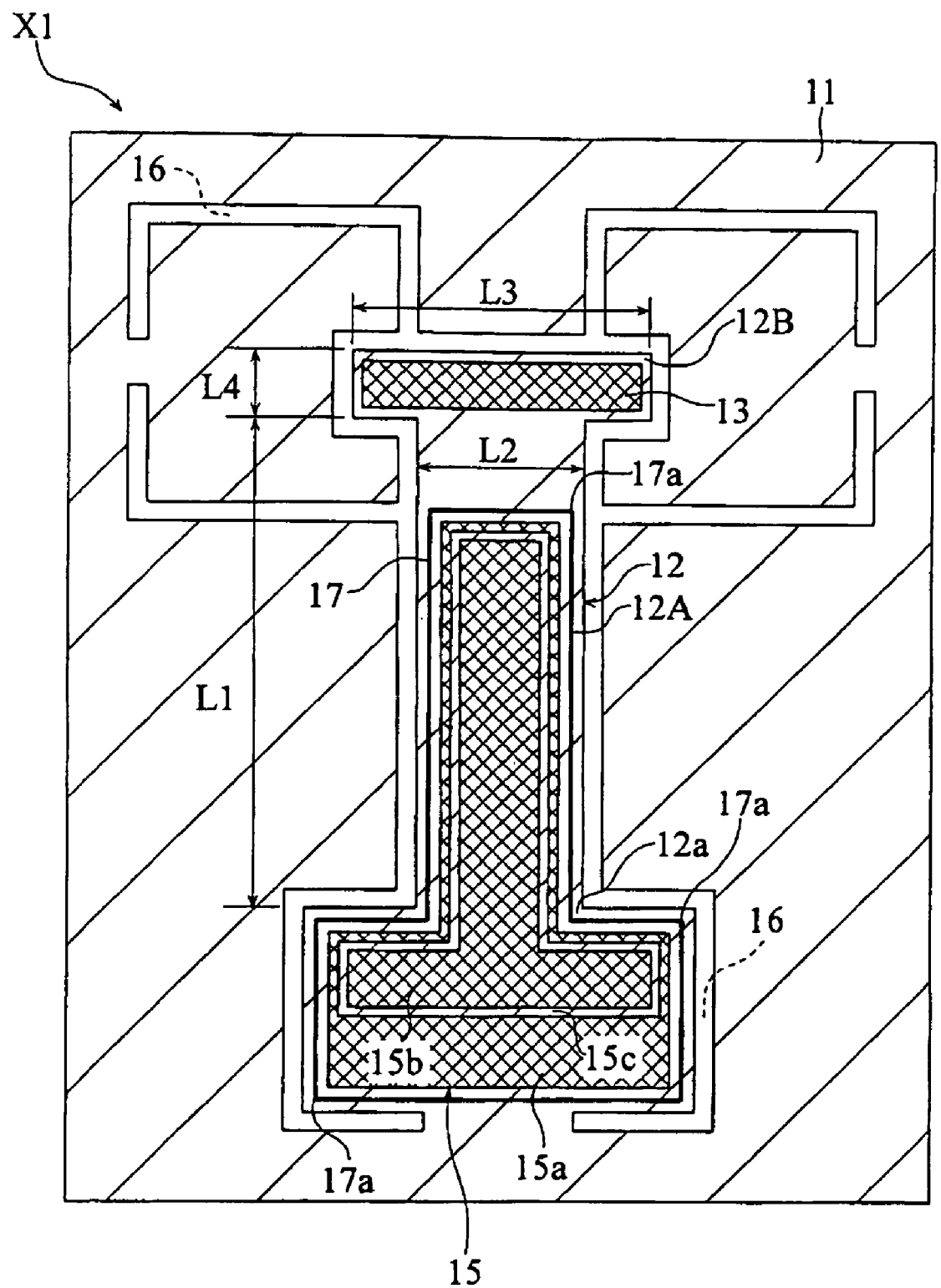
FIG. 2 is a partially non-illustrated plan view of the micro switching device in FIG. 1.
Figure 3:
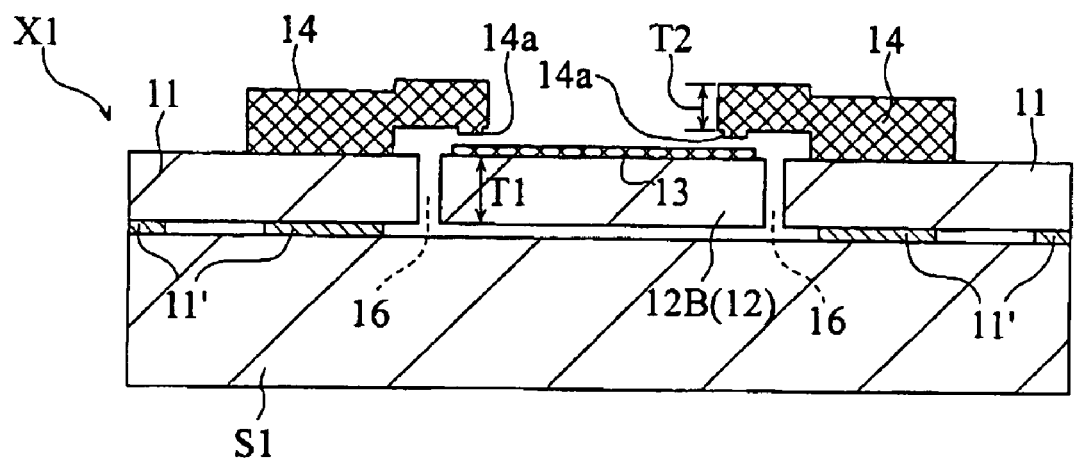
FIG. 3 is a sectional view taken in lines III-III in FIG. 1.
Figure 4:
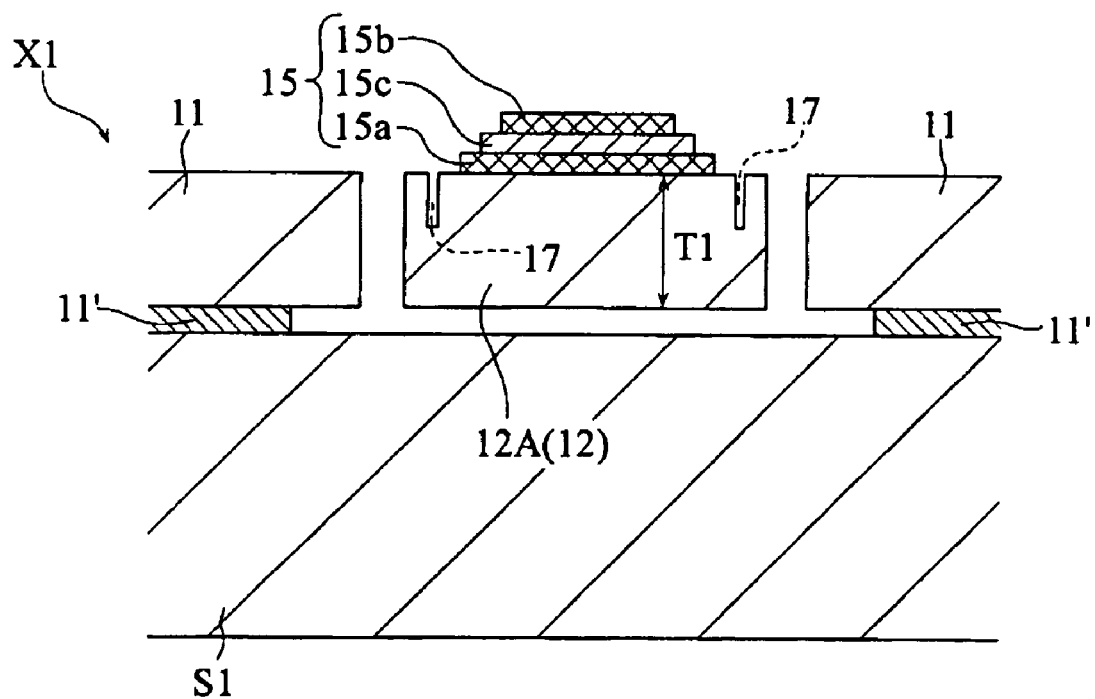
FIG. 4 is an enlarged sectional view taken in lines IV-IV in FIG. 1.
Figure 5:
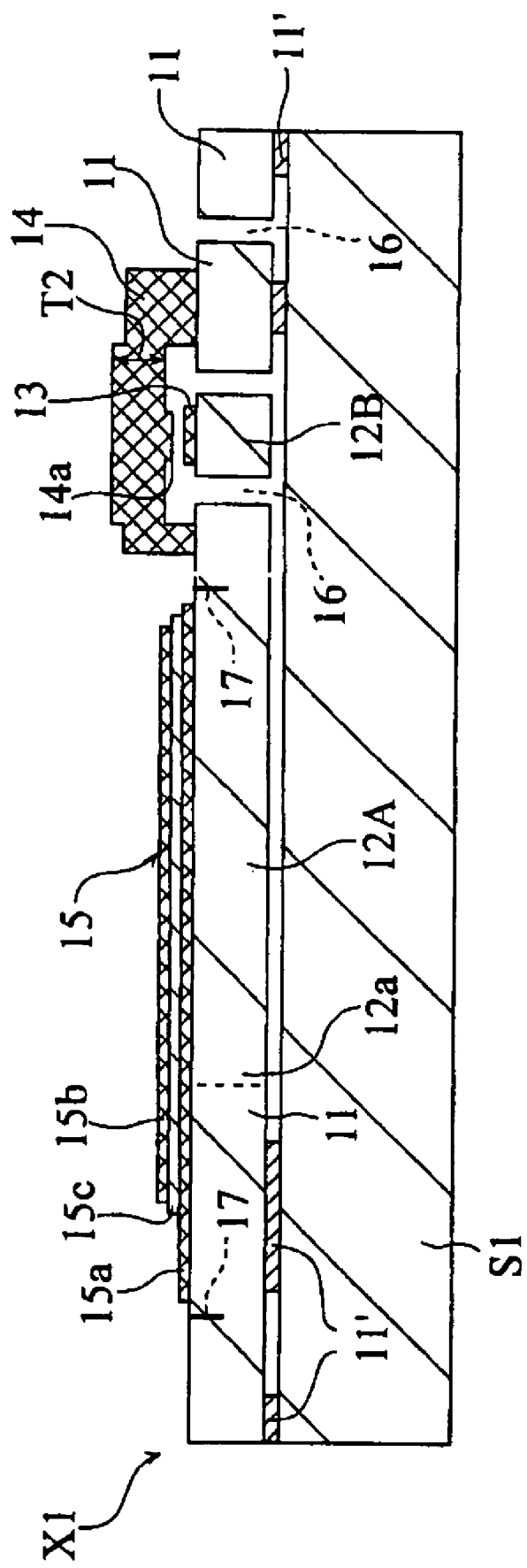
FIG. 5 is a sectional view taken in lines V-V in FIG. 1.
Figure 6:
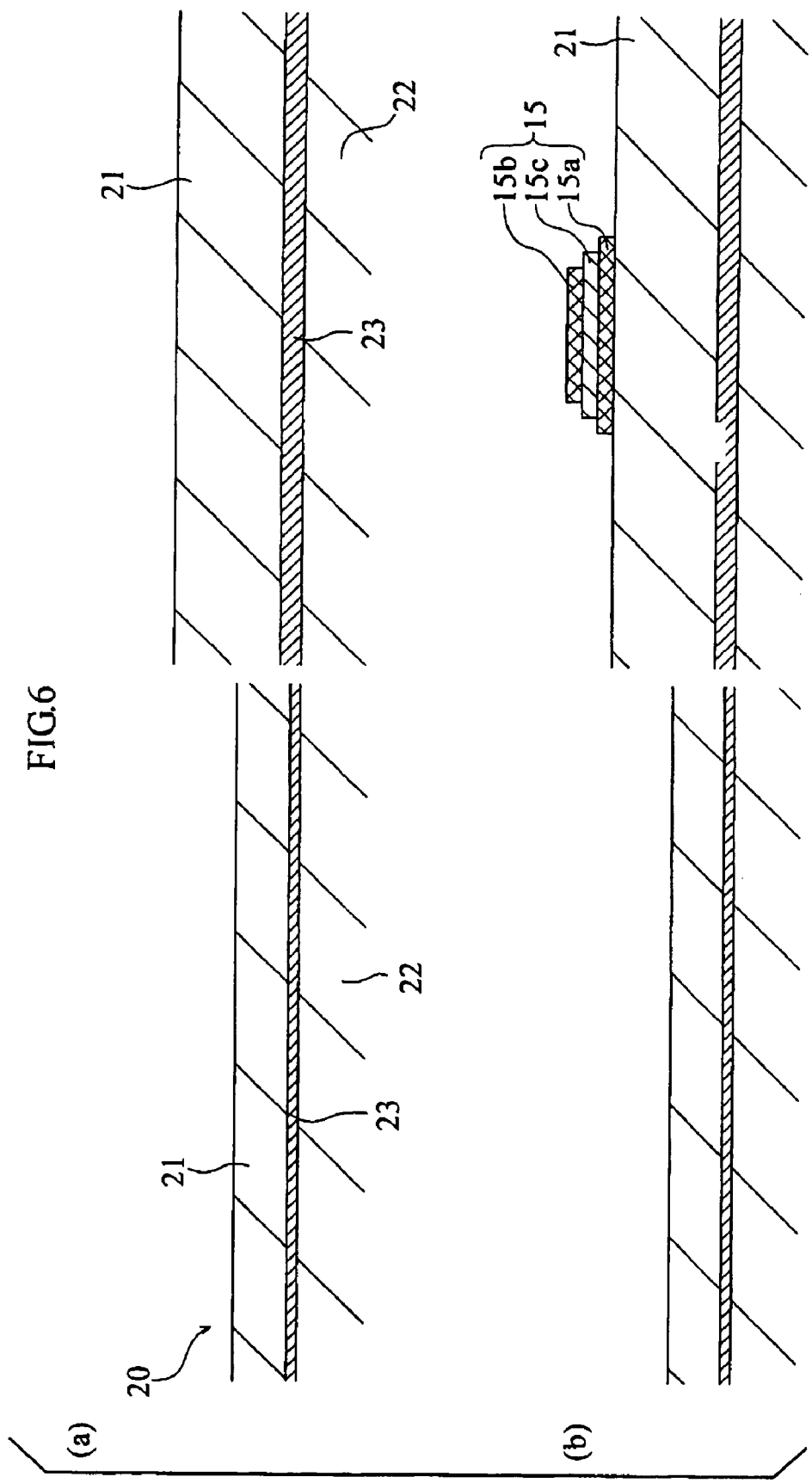
FIG. 6 shows a few steps in a method of making the micro switching device in FIG. 1.
Figure 7:
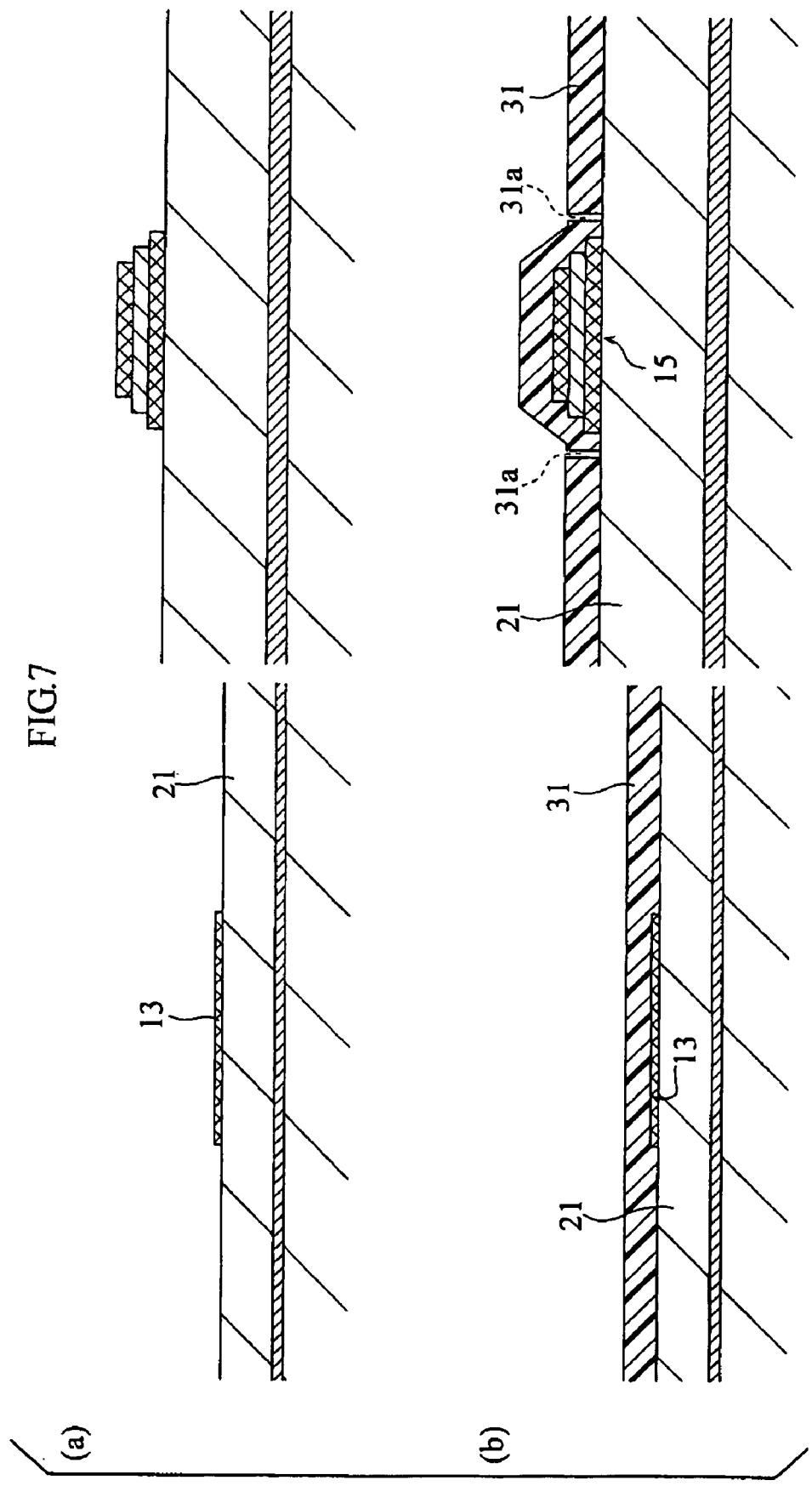
FIG. 7 shows steps following the steps in FIG. 6.
Figure 8:
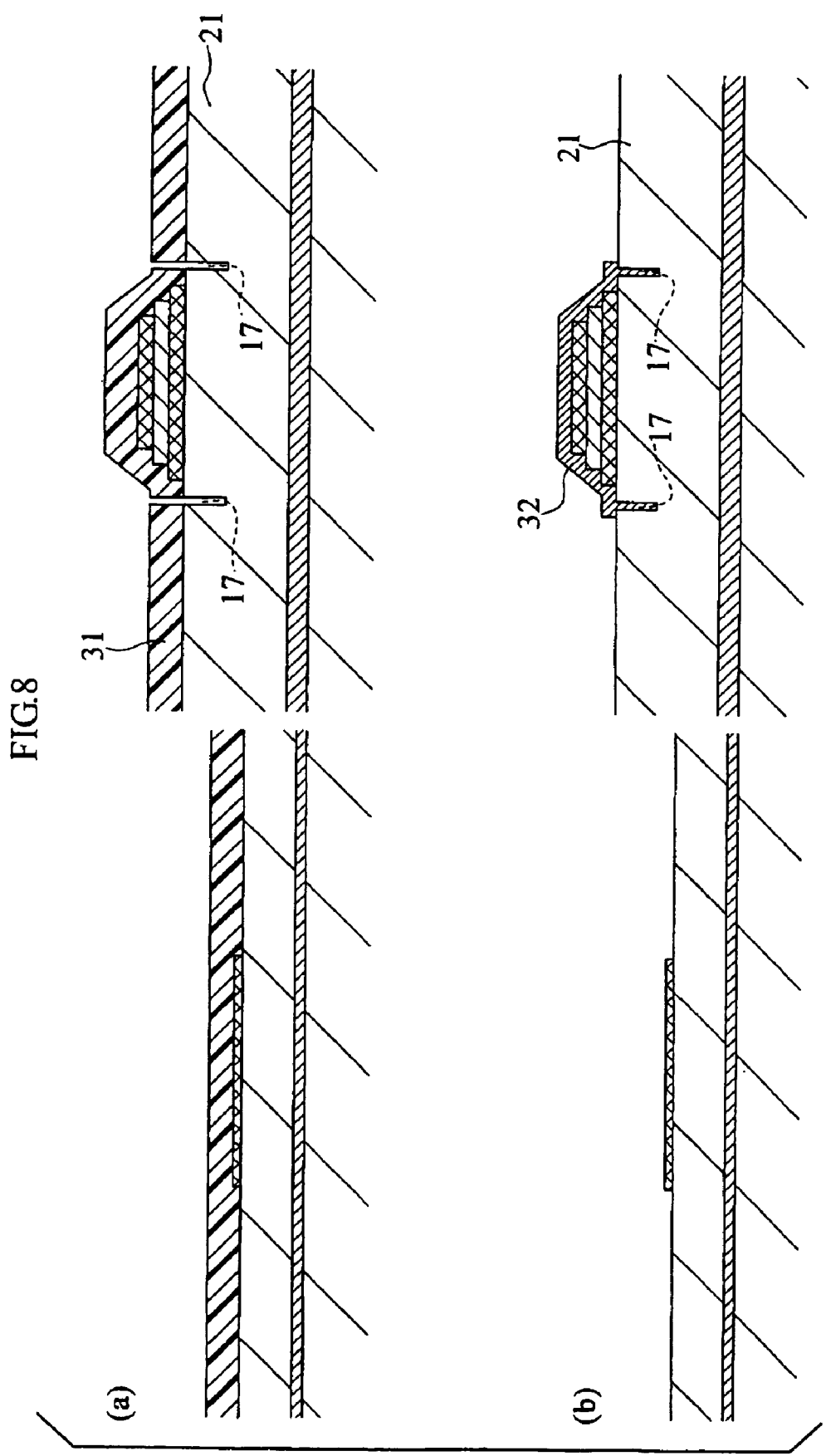
FIG. 8 shows steps following the steps in FIG. 7.
Figure 9:
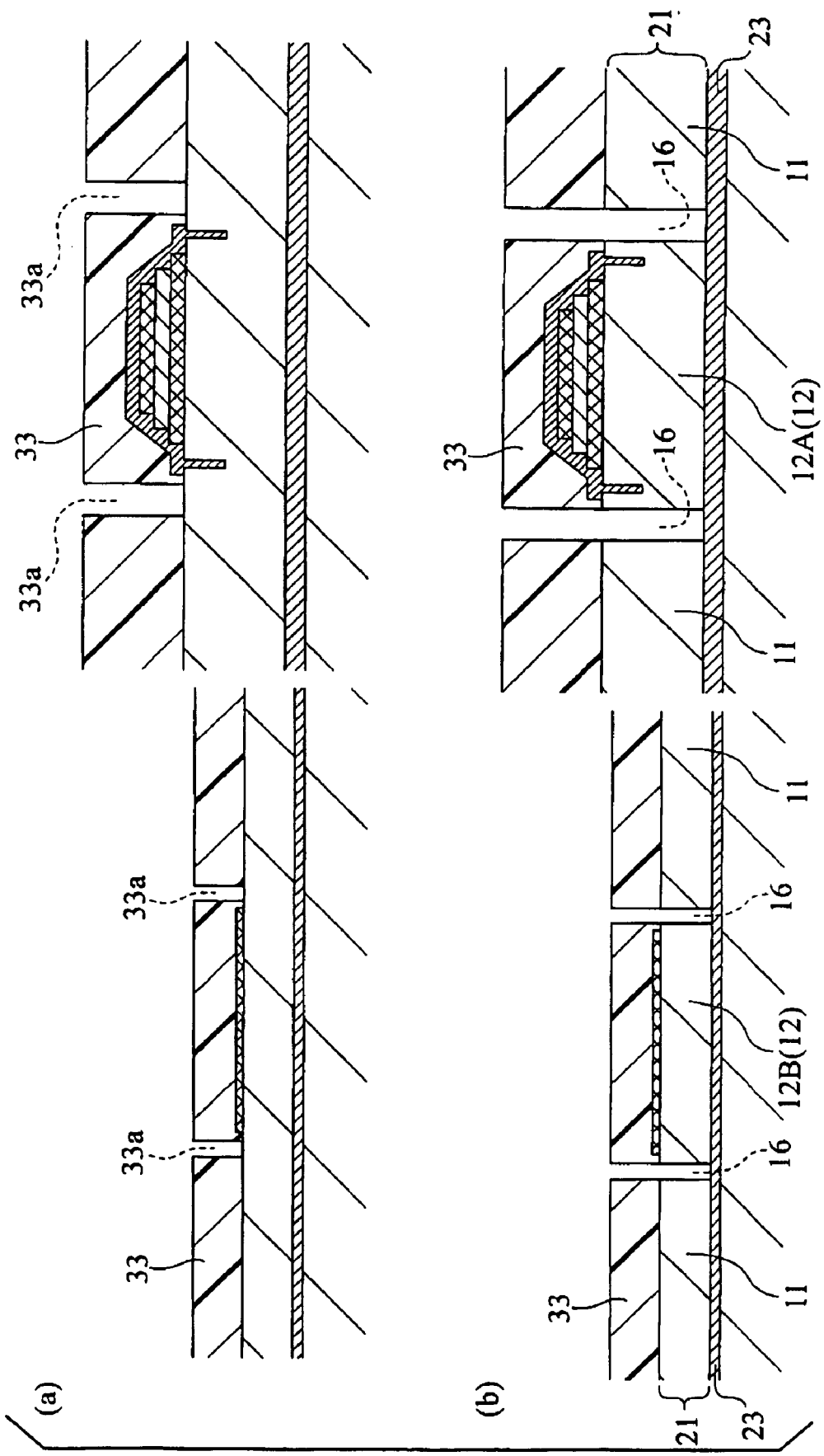
FIG. 9 shows steps following the steps in FIG. 8.
Figure 10:
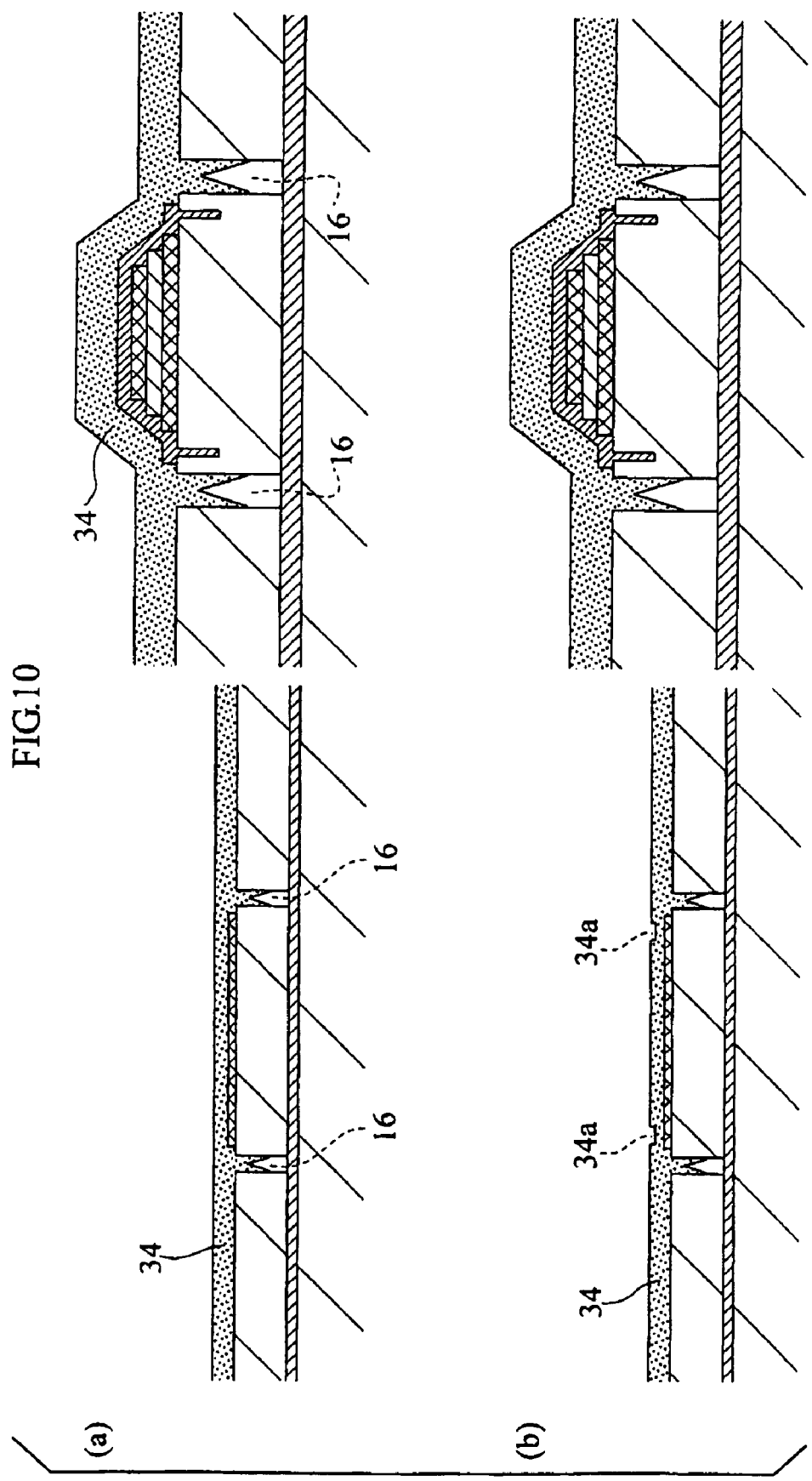
FIG. 10 shows steps following the steps in FIG. 9.
Figure 11:
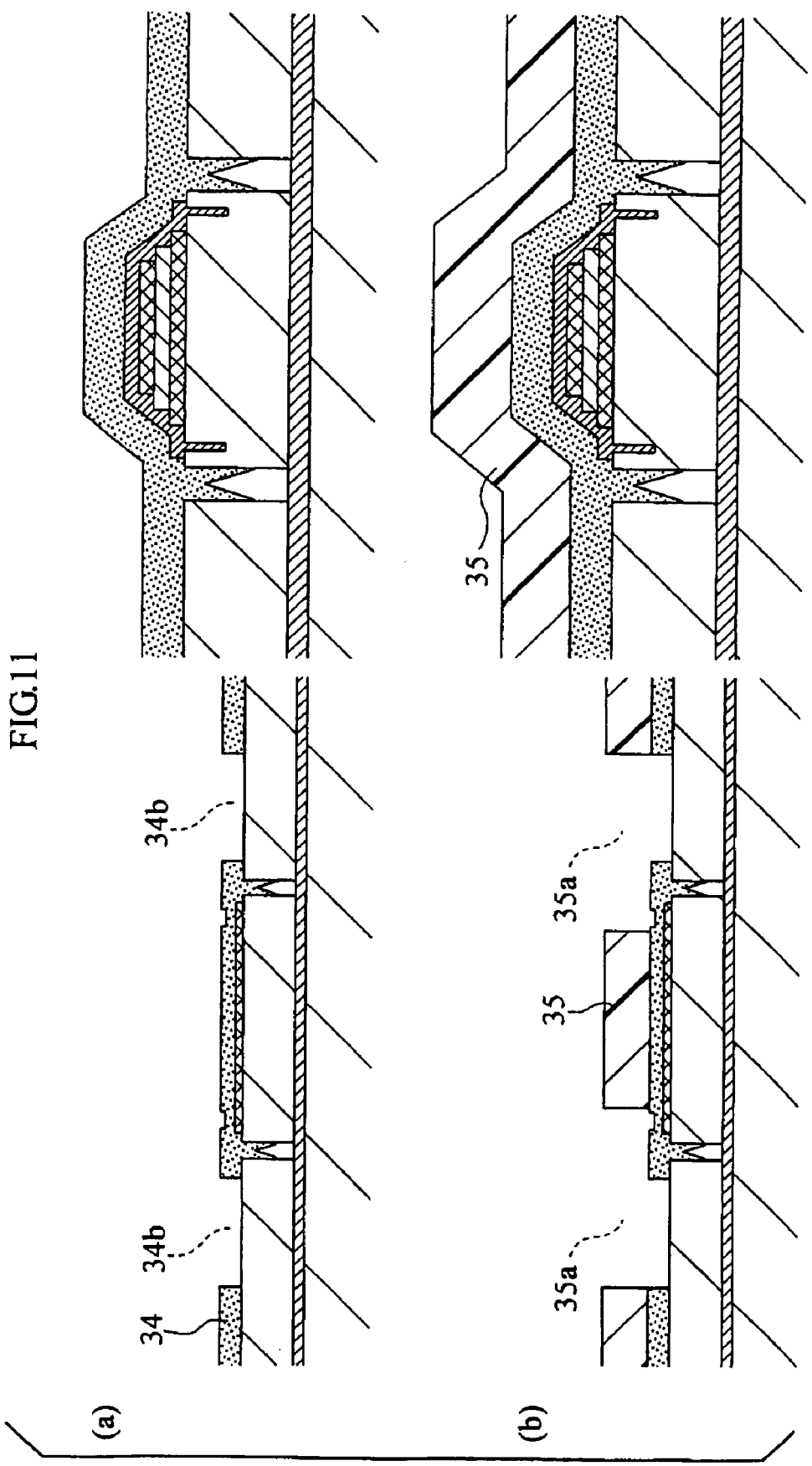
FIG. 11 shows steps following the steps in FIG. 10.
Figure 12:
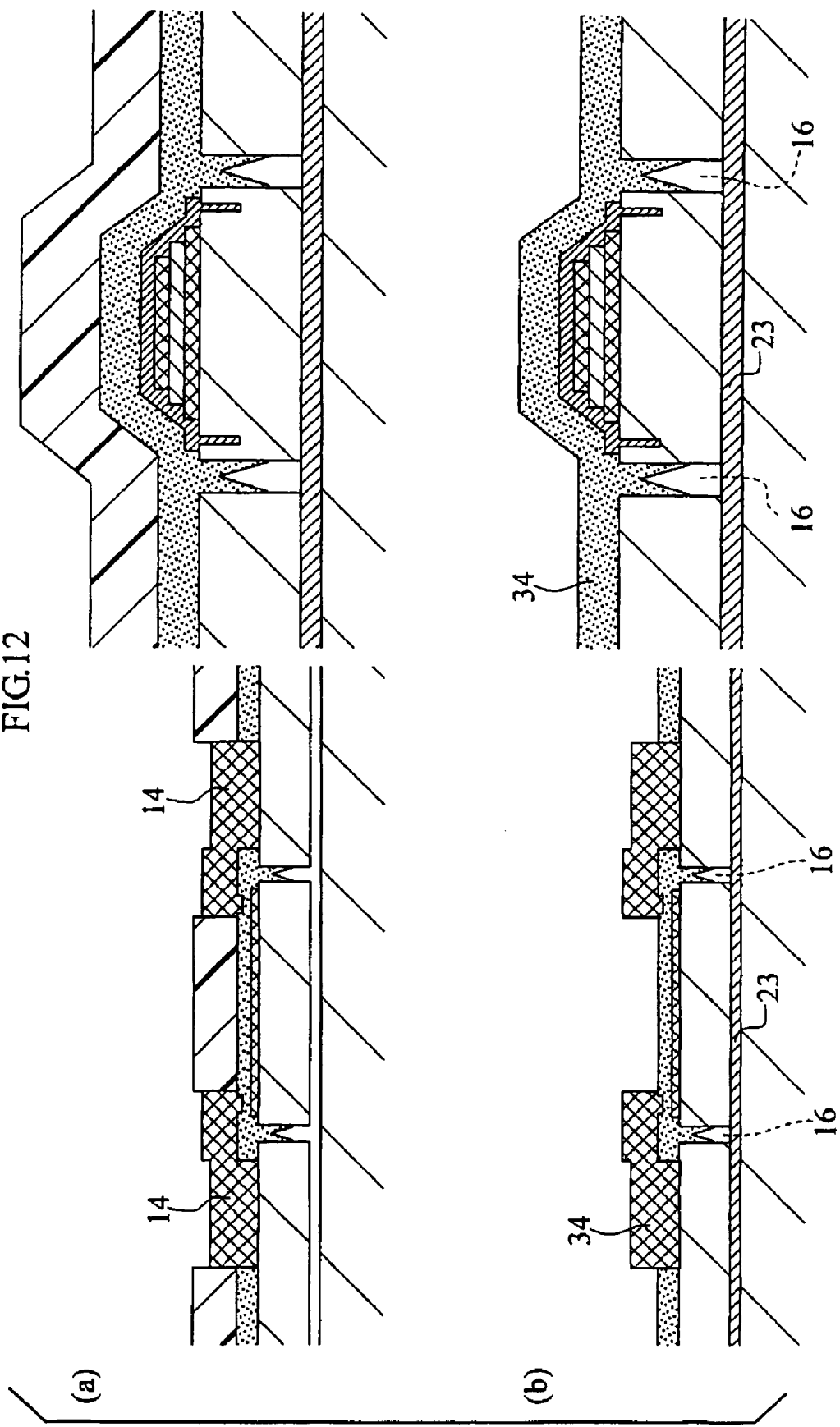
FIG. 12 shows steps following the steps in FIG. 11.
Figure 13:
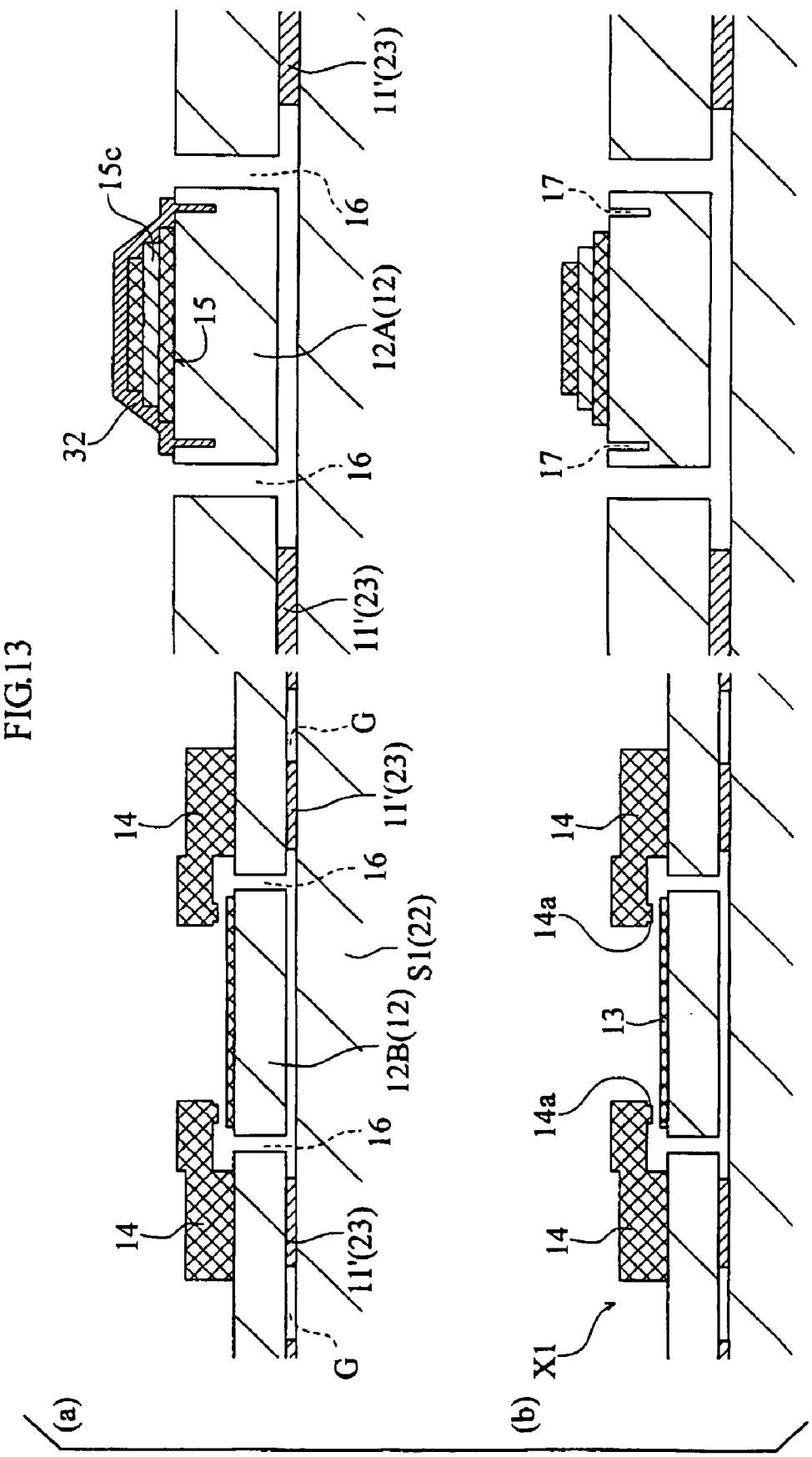
FIG. 13 shows steps following the steps in FIG. 12.
Figure 17:
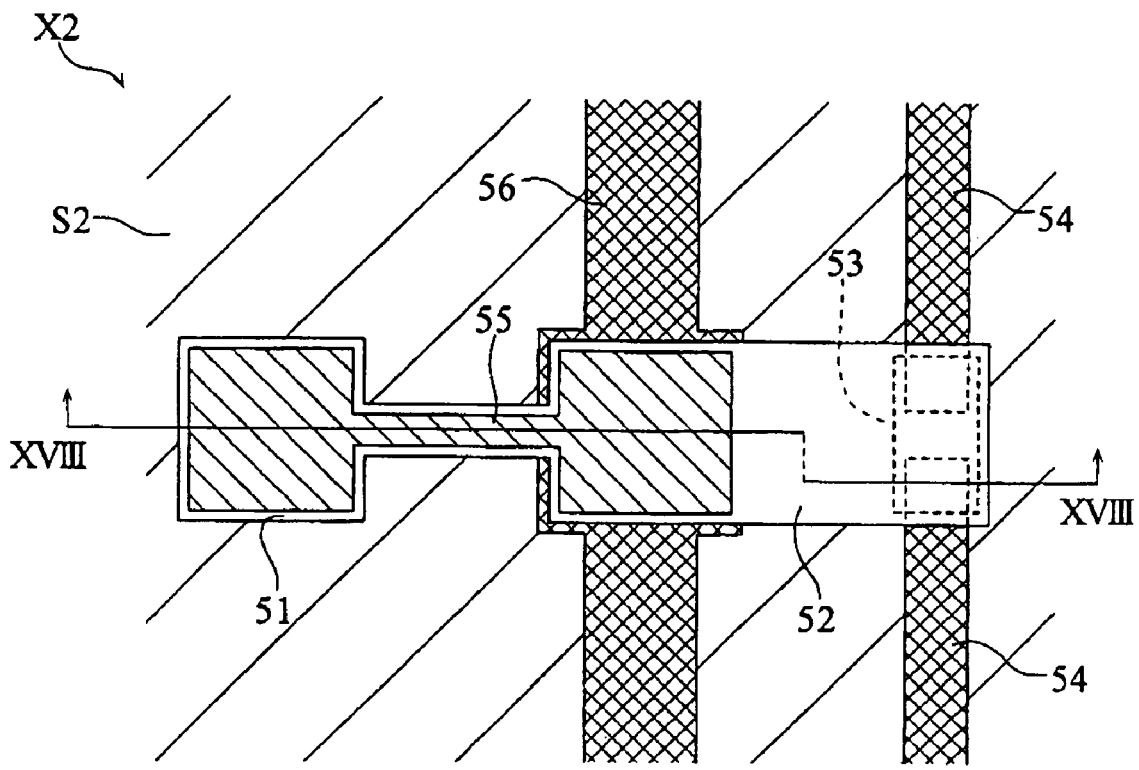
FIG. 17 is a partial plan view of a conventional micro switching device manufactured by means of MEMS technology.
Figure 18:
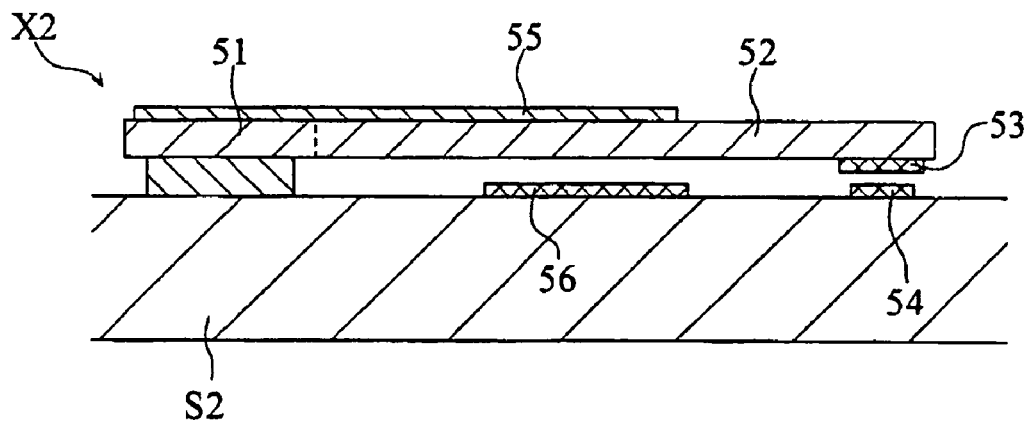
FIG. 18 is a sectional view taken in lines XVIII-XVIII in FIG. 17.
Figure 19:
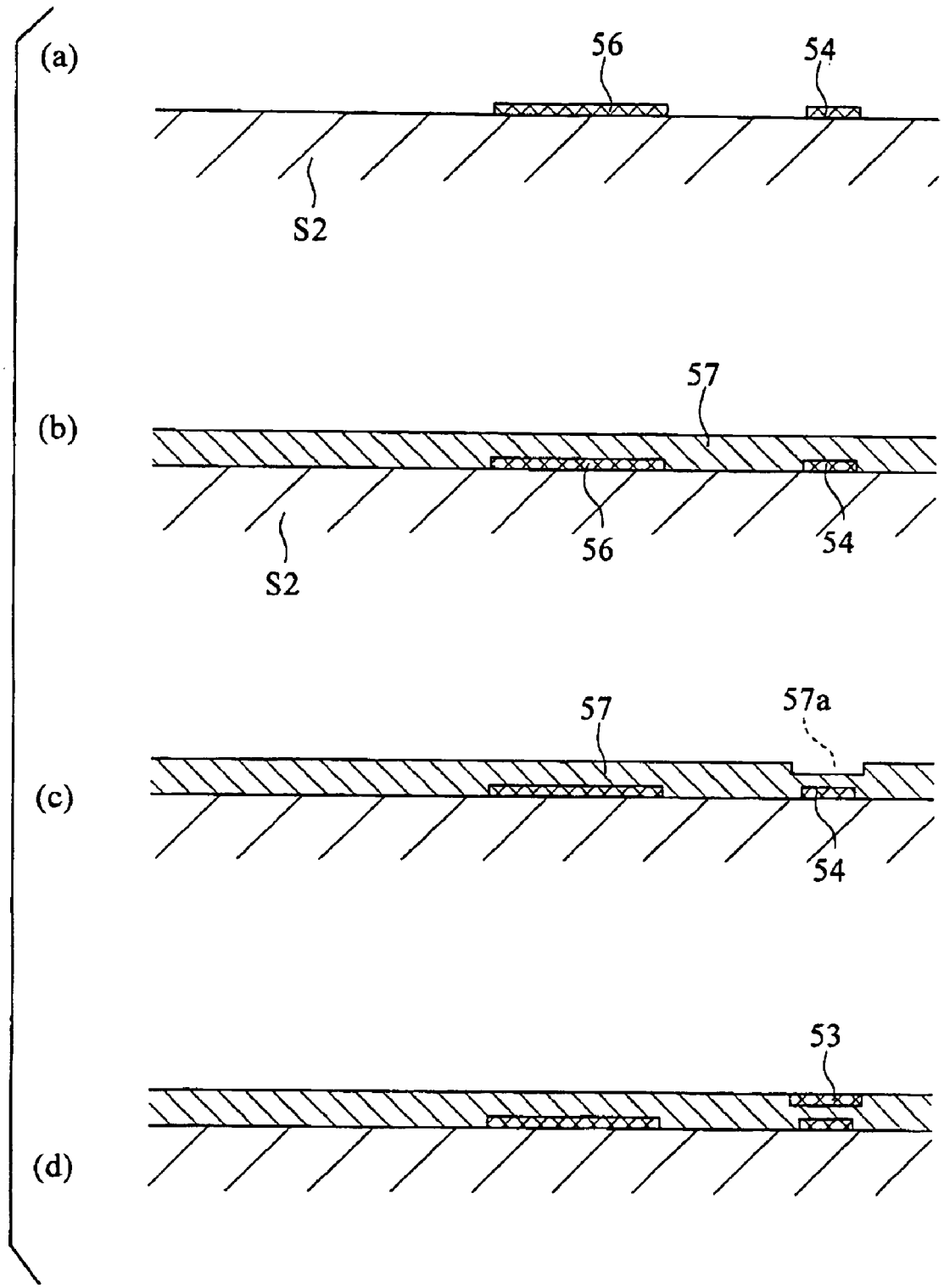
FIG. 19 shows a few steps in a method of making the micro switching device in FIG. 17.
Figure 21:
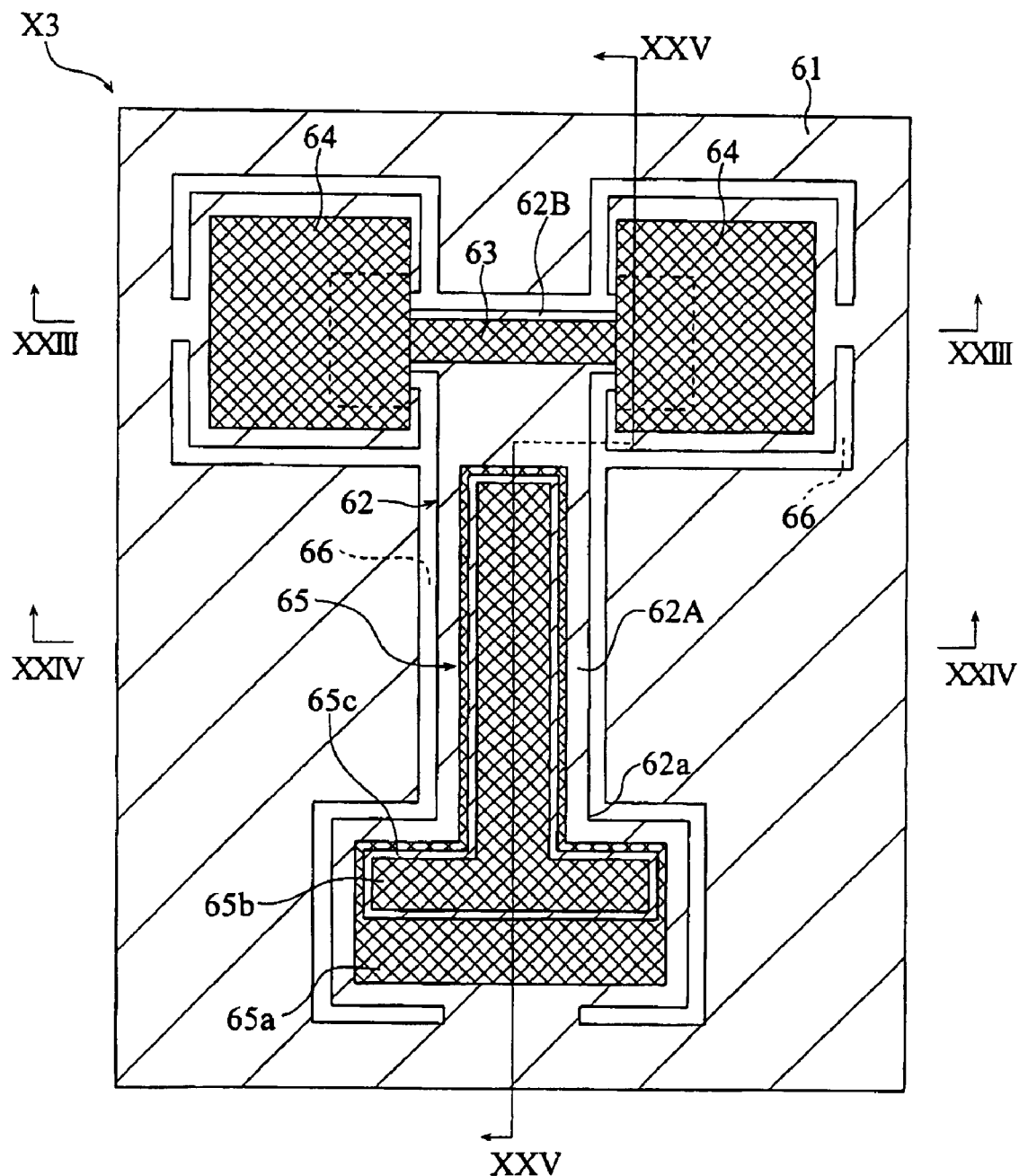
FIG. 21 is a plan view of a micro switching device according to a previous patent application.
Figure 22:
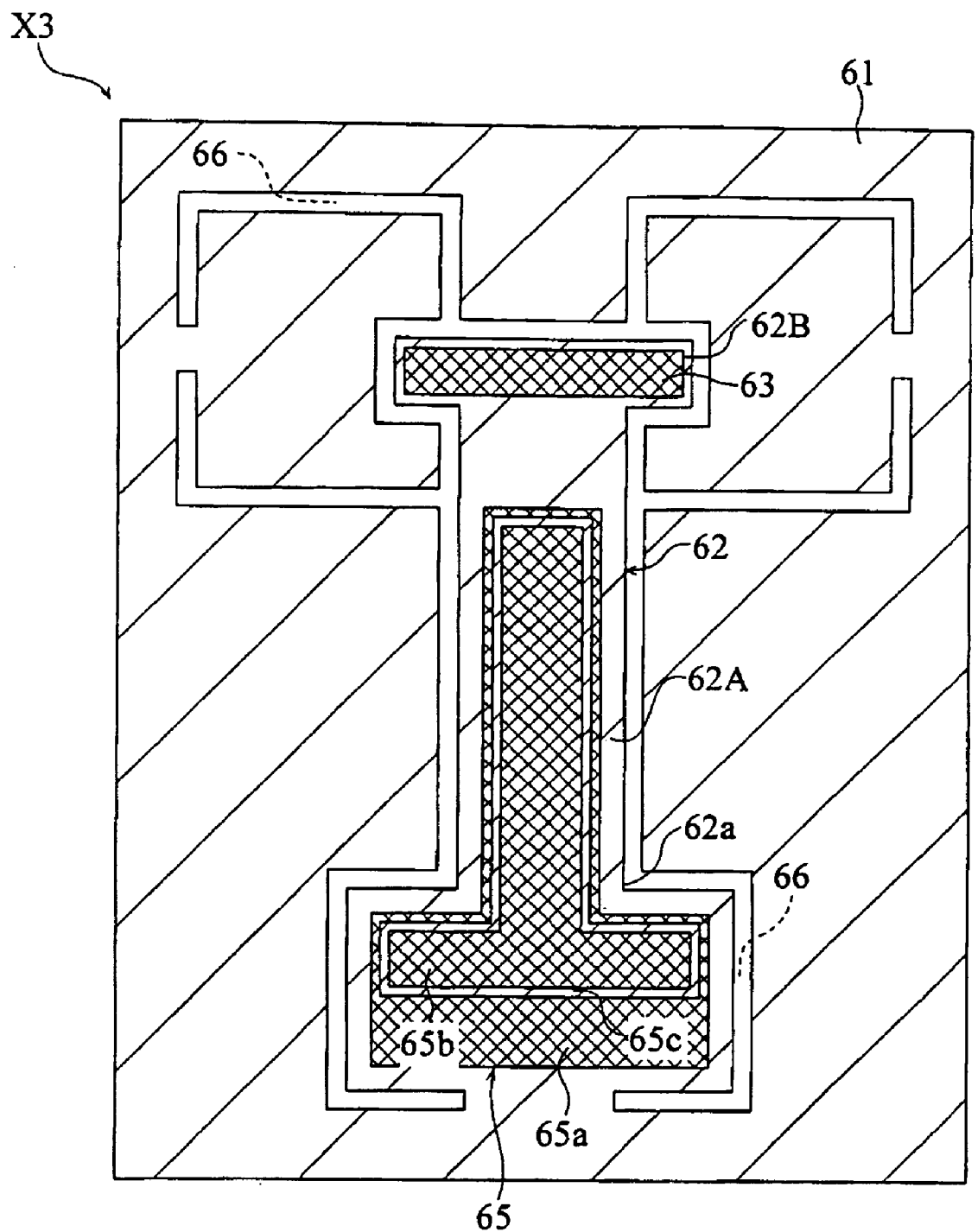
FIG. 22 is a partially non-illustrated plan view of the micro switching device in FIG. 21.
Figure 23:
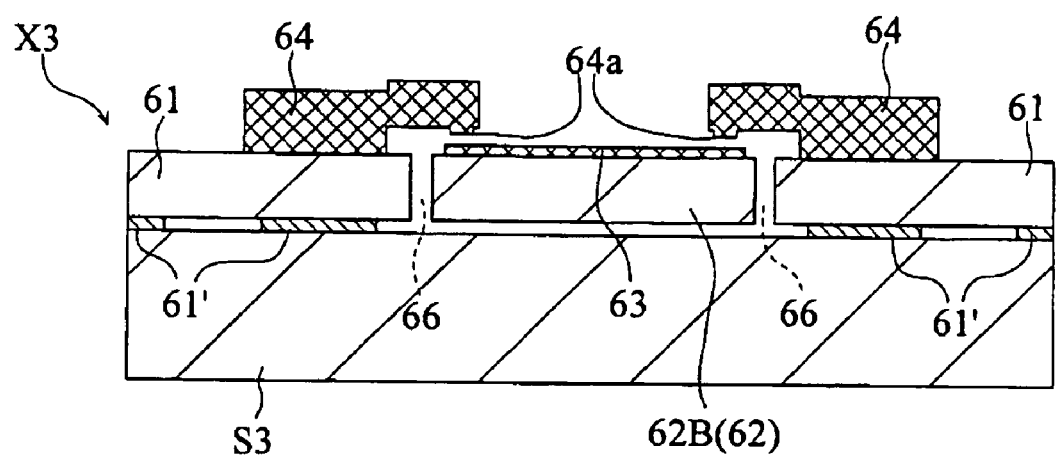
FIG. 23 is a sectional view taken in lines XXIII-XXIII in FIG. 21.
Figure 24:
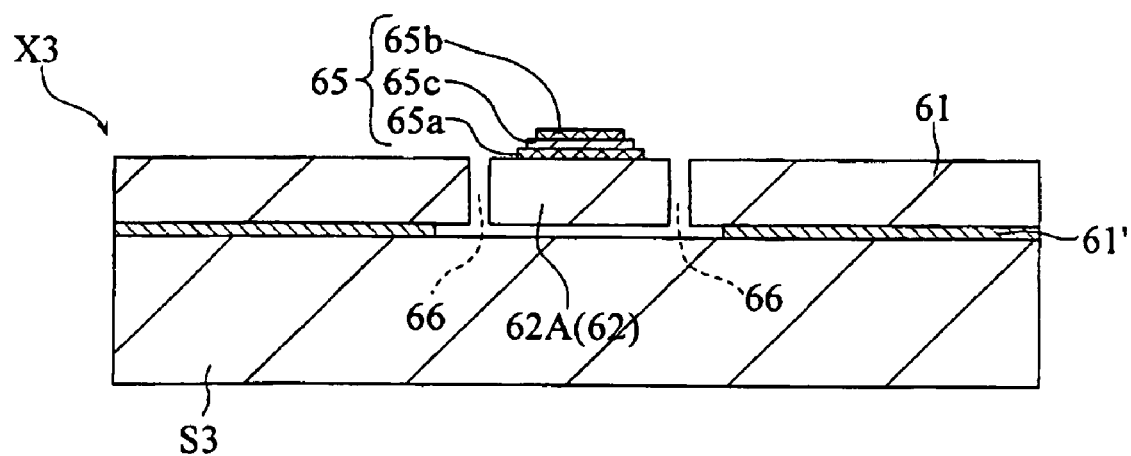
FIG. 24 is a sectional view taken in lines XXIV-XXIV in FIG. 21.
Figure 25:
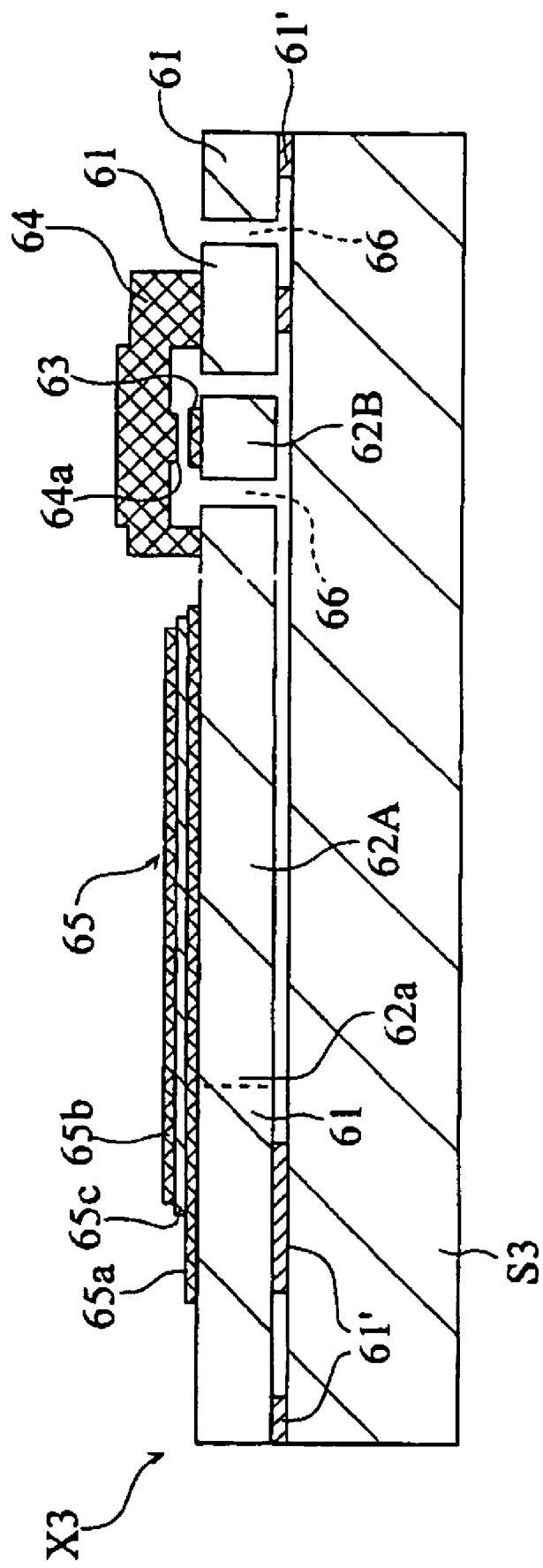
FIG. 25 is a sectional view taken in lines XXV-XXV in FIG. 21.
Figure 26:
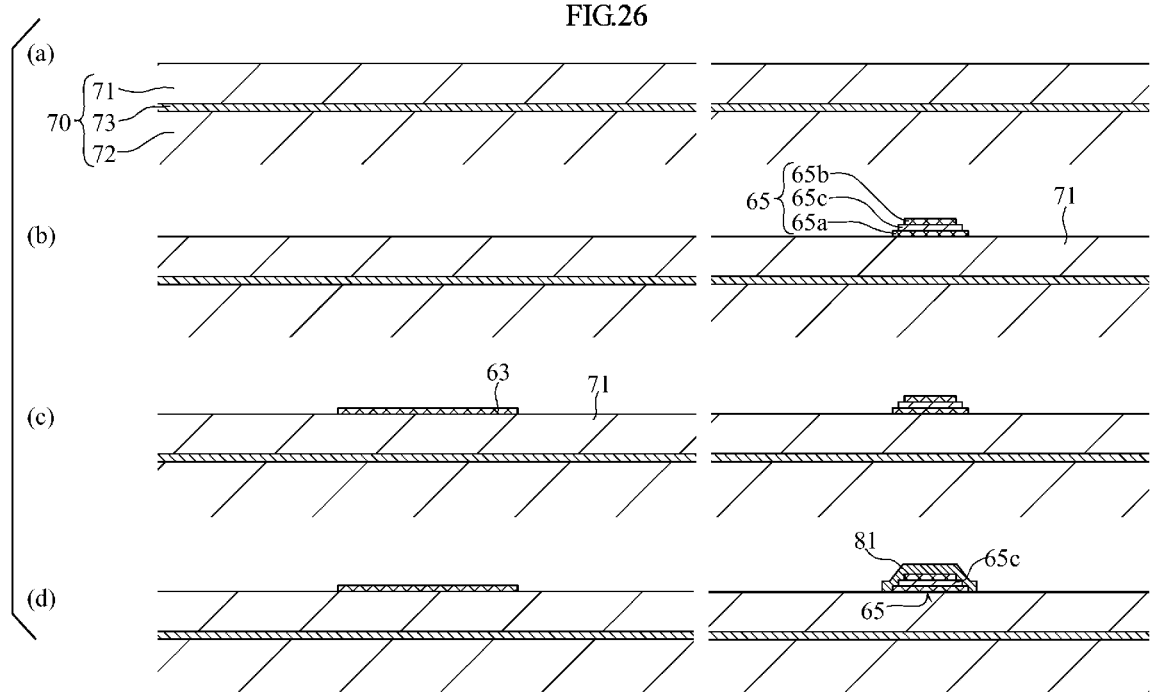
FIG. 26 shows a few steps in a method of making the micro switching device in FIG. 21.
Figure 27:
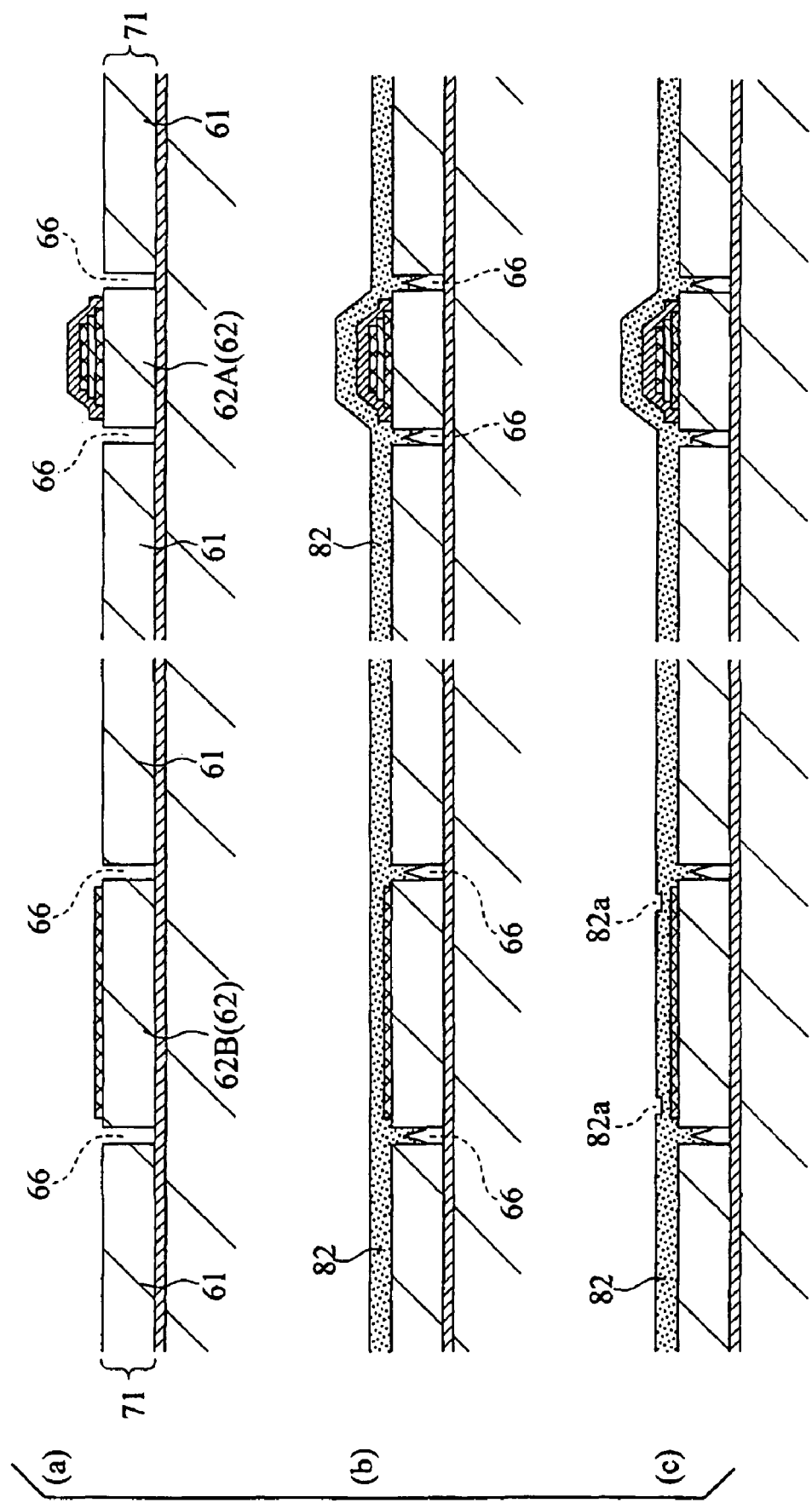
FIG. 27 shows steps following the steps in FIG. 26.
Figure 28:
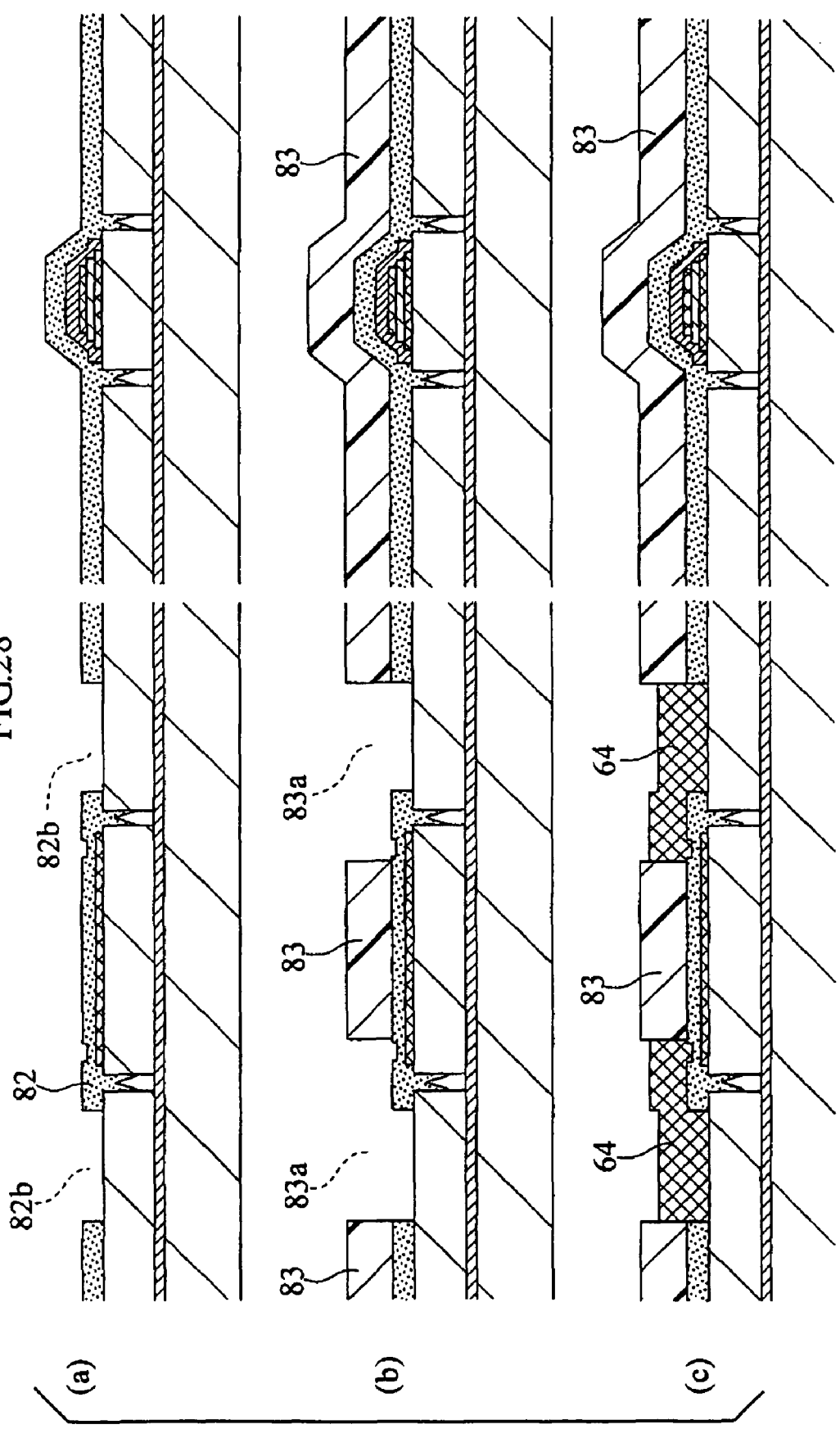
FIG. 28 shows steps following the steps in FIG. 27.
Figure 29:
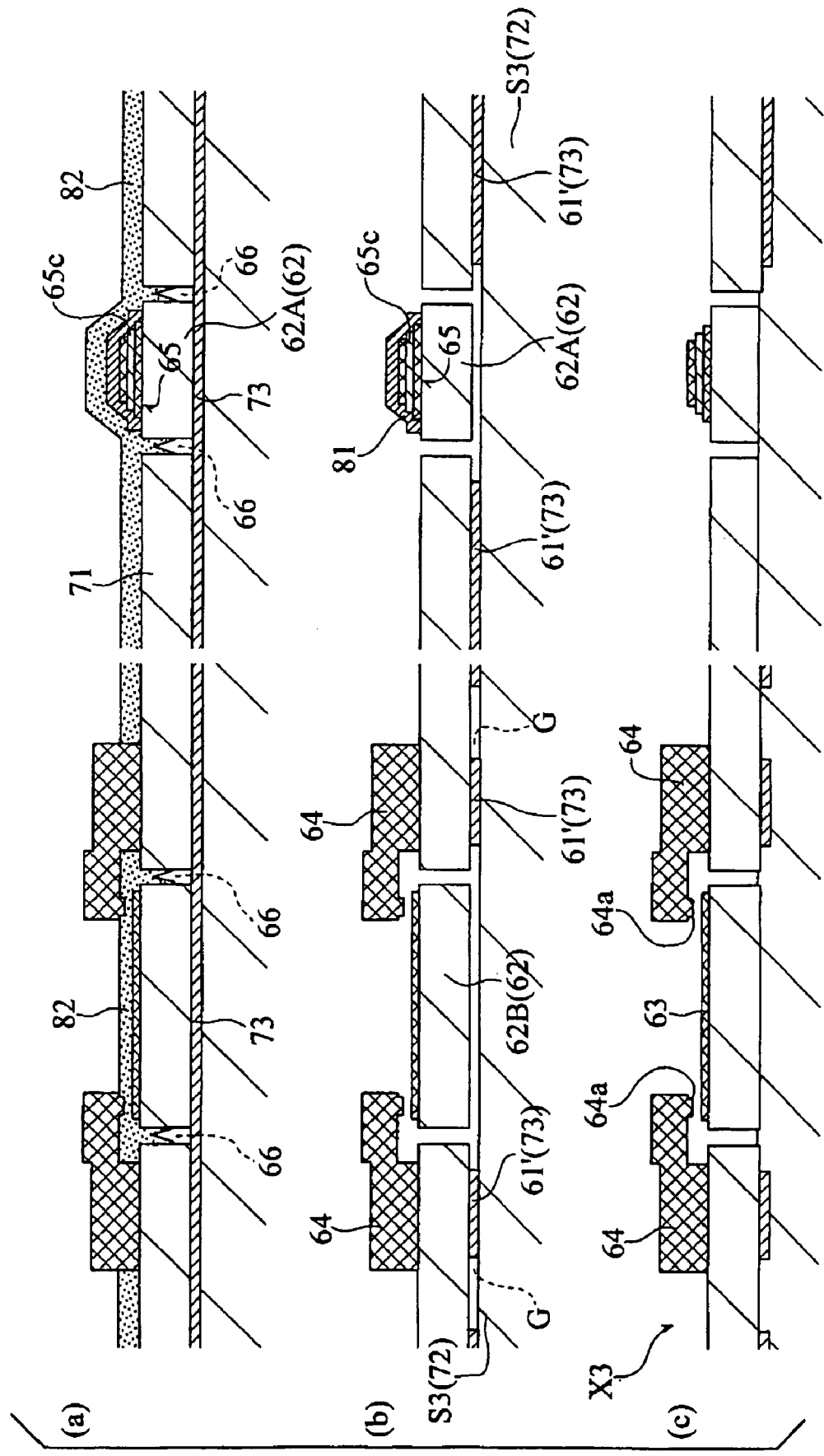
FIG. 29 shows steps following the steps in FIG. 28.

FIG. 1 through FIG. 5 show a micro switching device X1 as an embodiment of a micro movable element according to the present invention. FIG. 1 is a plan view of the micro switching device X1. FIG. 2 is a particularly non-illustrated plan view of the micro switching device X1. FIG. 3 and FIG. 5 are sectional views taken in lines III-III and V-V in FIG. 17 respectively. FIG. 4 is an enlarged sectional view taken in lines IV-IV in FIG. 1.

The micro switching device X1 includes a base substrate S1, a fixed portion 11, a movable portion 12, a movable contact 13, a pair of fixed contact electrodes 14 (not illustrated in FIG. 2), and a piezoelectric drive 15.

As shown in FIG. 3 through FIG. 5, the fixed portion 11 is bonded to the base substrate S1 via a border layer 11'. The fixed portion 11 is made of silicon material such as monocrystal silicon. The silicon material for the fixed portion 11 should preferably be an N-type, and have a resistivity not smaller than 1000Ω·cm. The border layer 11' is made of silicon oxide for example.

As shown in FIG. 2 for example, the movable portion 12 has a fixed end 12a fixed to the fixed portion 11, extends along the base substrate S1 as shown in FIG. 5, and is surrounded by the fixed portion 11, via a slit 16. The movable portion 12 has a body 12A and a head 12B. The movable portion 12 has a thickness T1 indicated in FIG. 3 and FIG. 4 which is e.g. not smaller than 5 µm. The body 12A has a length L1 indicated in FIG. 2, which is e.g. 400 µm, whereas a length L2 is e.g. 30 µm. The head 12B has a length L3 indicated in FIG. 2, which is e.g. 100 µm, whereas the length L4 is e.g. 30 µm. The slit 16 has a width of e.g. 2 µm. The movable portion 12 is made of e.g. monocrystal silicon. If the movable portion 12 is made of monocrystal silicon, unwanted internal stress is not very much likely to develop in the movable portion 12. In conventional MEMS switches, the movable portion is sometimes made by means of thin-film formation technology. In this case, internal stress is likely to develop in the movable portion, and this internal stress often causes a problem of undue deformation of the movable portion. Undue deformation of the movable portion is undesirable because it leads to deteriorated characteristics of the MEMS switch.

As clearly shown in FIG. 2, the movable contact 13 is provided on the head 12B of the movable portion 12. As shown in FIG. 3 and FIG. 5, each of the fixed contact electrodes 14 is erected on the fixed portion 11, and has a contact region 14a which faces the movable contact 13. The fixed contact electrodes 14 have a thickness T2 which is e.g. not smaller than 5 µm. Each of the fixed contact electrodes 14 is connected with a predetermined circuit which is served by the switching device, via a predetermined wiring (not illustrated). The movable contact 13 and the fixed contact electrodes 14 are preferably made of a precious metal selected from a group consisting of Au, Pt, Pd and Ru, or an alloy containing the selected precious metal.

The piezoelectric drive 15 includes electrode films 15a, 15b and a piezoelectric film 15c between the two, and is provided on the movable portion 12 and the fixed portion 11. Each of the electrode films 15a, 15b has a laminate structure provided by e.g. a Ti underlayer and a Pt main layer. The electrode film 15b is grounded via a predetermined wiring (not illustrated). The piezoelectric film 15c is made of a piezoelectric material which is a material distinguished by a nature (inverse piezoelectric effect) that the material is distorted upon application of an electric field. Examples of such a piezoelectric material include PZT (a solid solution of $PbZrO_3$ and $PbTiO_3$), ZnO doped with Mn, ZnO and AlN. The electrode films 15a, 15b have a thickness of e.g. 0.55 µm, whereas the piezoelectric film 15c has a thickness of e.g. 1.5 µm.

As shown in FIGS. 1, 2, 4 and 5, the fixed portion 11 and the movable portion 12 are provided with a groove 17. For the sake of illustrative simplicity, FIGS. 1, 2 and 5 show the groove 17 in a thick line. The groove 17 extends along the piezoelectric drive 15, and has right-angled corners 17a. The depth of the groove 17 is e.g. 3 through 15 μm, provided that the value is smaller than the thickness of the fixed portion 11 and movable portion 12. The width of the groove 17 is e.g. 1 through 5 μm.

In the micro switching device X1 which has the structure as described above, when a predetermined positive electric potential is applied to the electrode film 15a, an electric field is generated between the electrode film 15a and the electrode film 15b, and a contractive force is generated in the piezoelectric film 15c in its in-plane directions. Shrinkage of the piezoelectric material in the in-plane directions of the piezoelectric film 15c is greater at a place farther away from the electrode film 15a which is supported directly by the movable portion 12, i.e. there is more shrinkage at a place closer to the electrode film 15b. For this reason, the amount of in-plane shrinkage resulting from the above-described contractive force gradually increases from the side closer to the electrode film 15a toward the side closer to the electrode film 15b, within the piezoelectric film 15c, making the movable portion 12 elastically deform to bring the movable contact 13 into contact with the fixed contact electrodes 14 or the contact region 14a. This brings the micro switching device X1 into a closed state. In the closed state, the movable contact 13 bridges the pair of fixed contact electrodes 14, allowing an electric current to pass through the pair of fixed contact electrodes 14. In this way, it is possible to make an ON state of e.g. a high-frequency signal.

Now, the micro switching device X1 being in the closed state, when the electric field between the electrode film 15a and the electrode film 15b is ceased by stopping the application of the electric potential to the piezoelectric drive 15, the piezoelectric film 15c and the movable portion 12 return to their natural states, allowing the movable contact 13 to come away from the fixed contact electrodes 14. Thus, the micro switching device X1 is brought to an open state. In the open state, the fixed contact electrodes 14 are electrically disconnected from each other, so no electric current can pass through the pair of fixed contact electrodes 14. In this way, it is possible to make an OFF state of e.g. a high-frequency signal.

FIG. 6 through FIG. 13 show a method of manufacturing the micro switching device X1. The figures show changes in part of the section taken in lines III-III in FIG. 1, as well as changes in part of the section taken in lines IV-IV in FIG. 1. In the manufacture of the micro switching device X1, first, a substrate 20 as shown in FIG. 6(a) is prepared. The substrate 20 is an SOI (silicon on insulator) substrate, having a laminate structure provided by a first layer 21, a second layer 22 and a middle layer 23 between the two. In the present embodiment, the first layer 21 has a thickness of e.g. 10 μm, the second layer 22 has a thickness of e.g. 400 μm and the middle layer 23 has a thickness of e.g. 2 μm. The first layer 21 is made of e.g. monocrystal silicon, from which the fixed portion 11 and the movable portion 12 as described above are to be formed. The second layer 22 is made of e.g. monocrystal silicon, from which the substrate S1 is to be formed. The middle layer 23 is made of an insulating material in the present embodiment. Examples of such an insulating material include silicon oxide and silicon nitride.

Next, as shown in FIG. 6(b), a piezoelectric drive 15 is formed on the first layer 21 of the substrate 20. In forming the piezoelectric drive 15, first, a first conductive film is formed on the first layer 21, for formation of an electrode film 15a. Next, a film of a piezoelectric material is formed on the first conductive film, for formation of a piezoelectric film 15c. Next, a second conductive film is formed on the film of piezoelectric material, for formation of an electrode film 15b. Thereafter, each film is patterned in an etching process using a predetermined mask. The first and the second conductive films can be formed by sputtering method for example, by first forming a film of Ti and then forming a film of e.g. Pt thereon. The Ti film has a thickness of e.g. 50 nm whereas the Pt film has a thickness of e.g. 500 nm. The film of piezoelectric material can be formed by sputtering method for example, by forming a film of a predetermined piezoelectric material.

Next, as shown in FIG. 7(a), a movable contact 13 is formed on the first layer 21. This can be done for example, by first forming a film of Cr on the first layer 21 by sputtering, and then forming thereon a film of e.g. Au. The Cr film has a thickness of e.g. 50 nm whereas the Au film has a thickness of e.g. 500 nm. Next, a photolithographic method is used to form a predetermined resist pattern on this multi-layered conductive film, and then an etching process is performed to the multi-layered conductive film, using the resist pattern as a mask. In this way, it is possible to pattern the movable contact 13 on the first layer 21.

Next, as shown in FIG. 7(b), a photolithographic method is used to form a resist pattern 31 on the first layer 21 while covering the piezoelectric drive 15 and the movable contact 13. The resist pattern 31 has an opening 31a which corresponds to the groove 17 that extends along the piezoelectric drive 15.

Next, as shown in FIG. 8(a), a groove 17 is formed. Specifically, an anisotropic etching process is performed to the first layer 21 using the resist pattern 31 as a mask, until the first layer 21 is etched to a midway of its thickness. The etching can be achieved by DRIE (deep reactive ion etching). In DRIE, good anisotropic etching is achievable in a Bosch process in which etching and side-wall protection are alternated with each other.

Next, the resist pattern 31 is removed and then, as shown in FIG. 8(b), a protective film 32 is formed which covers the piezoelectric drive 15 and the groove 17, and fills the groove 17. Specifically, a film of photosensitive polyimide is formed on the substrate 20, on the side formed with the first layer 21, and then the photosensitive polyimide is patterned by photolithographic method, whereby the protective film 32 is formed. The protective film 32 has a thickness of e.g. 2 μm. The piezoelectric drive 15 (and the piezoelectric film 15c in particular) tends to be eroded by the etchant which is used in a wet etching process performed to remove a sacrifice layer 34 to be described later and part of the middle layer 23. The protective film 32 is for providing protection to these piezoelectric drive 15 and the piezoelectric film 15c, and is resistant to the etchant.

Next, as shown in FIG. 9(a), a resist pattern 33 is formed on the first layer 21 by photolithographic method. The resist pattern 33 has an opening 33a which corresponds to the slit 16 described earlier.

Next, as shown in FIG. 9(b), a slit 16 is formed. Specifically, an anisotropic etching process is performed to the first layer 21 using the resist pattern 33 as a mask until the middle layer 23 is reached. The etching can be achieved by DRIE (deep reactive ion etching). In this step, the first layer 21 is etched to form a fixed portion 11 and a movable portion 12.

Next, the resist pattern 33 is removed and then, as shown in FIG. 10(a), a sacrifice layer 34 is formed to plug the slit 16, on the surface of the substrate 20 formed with the first layer 21. The sacrifice layer 34 has a thickness of e.g. 4 μm. An example of the material for the sacrifice layer is silicon oxide. An example of method to form the sacrifice layer 34 is plasma CVD method. If a plasma CVD method is used, the substrate 20 is heated up to e.g. 200 through 300° C. The photosensitive polyimide for forming the protective film 32 according to the present embodiment is heat tolerant to an extent not to be deteriorated under such a level of high temperature. Note also that in this step, the material for the sacrifice layer deposits on part of the side walls of the slit 16, so the slit 16 is plugged.

Next, as shown in FIG. 10(b), two recesses 34a are formed in the sacrifice layer 34, at places corresponding to the movable contact 13. Specifically, a photolithographic method is used to form a predetermined resist pattern on the sacrifice layer 34, and then an etching process is performed to the sacrifice layer 34, using the resist pattern as a mask. The etching can be achieved by means of wet etching. Each of the recesses 34a is for formation of a contact region 14a of the fixed contact electrodes 14, and has a depth of e.g. 3 μm.

Next, as shown in FIG. 11(a), the sacrifice layer 34 is patterned to form open regions 34b. Specifically, a photolithographic method is used to form a predetermined resist pattern on the sacrifice layer 34, and then an etching process is performed to the sacrifice layer 34, using the resist pattern as a mask. The etching can be achieved by means of wet etching. The open regions 34b are regions the fixed portion 11 which the fixed contact electrodes 14 are bonded to.

Next, in the object structure shown in FIG. 11(a), an undercoating film (not illustrated) which serves as an electric path is formed on the surface provided with the sacrifice layer 34 and then, a resist pattern 35 is formed as shown in FIG. 11(b). The undercoating film can be formed by sputtering method for example, by first forming a film of Cr to a thickness of 50 nm and then forming a film of Au thereon to a thickness of 500 nm. The resist pattern 35 has open regions 35a corresponding to the pair of fixed contact electrodes 14.

Next, as shown in FIG. 12(a), the pair of fixed contact electrodes 14 is formed. Specifically, an electroplating method is used to grow a film of e.g. Au on the undercoating film exposed on the open regions 35a.

Next, as shown in FIG. 12(b), the resist pattern 35 is removed by etching. Thereafter, exposed portion of the undercoating film are removed by etching. These etching processes can be achieved by means of wet etching, each using a predetermined etchant.

Next, as shown in FIG. 13(a), the sacrifice layer 34 and part of the middle layer 23 are removed. Specifically, a wet etching process is performed to the sacrifice layer 34 and the middle layer 23. The etchant can be provided by buffered hydrofluoric acid (BHF). In this etching process, the sacrifice layer 34 is removed first and thereafter, part of the middle layer 23 is removed from places exposed to the slits 16. The etching process ceases when an appropriate gap is formed between the entire movable portion 20 and the second layer 22. FIG. 13(a) shows a gap G, which was formed by the etchant that entered from the slits 16, along the fixed contact electrodes 14 and etched the middle layer 23. In this way, it is possible to etch the middle layer 23 to leave a border layer 61'. Note that the second layer 22 will constitute the base substrate S1.

Next, a wet etching process is performed as necessary, to remove part of the undercoating film (e.g. Cr film) remaining on the bottom surface of the fixed contact electrodes 14, and then the entire device is dried by means of supercritical drying method. Thereafter, as shown in FIG. 13(b), the protective film 32 is removed. The removal can be made by e.g. RIE which uses $O_2$ gas as an etching gas.

By following the above-described steps, it is possible to manufacture the micro switching device X1. According to the above-described method, the fixed contact electrodes 14 which have the contact regions 14a faced by the movable contact 13 can be formed thickly on the sacrifice layer 34 by plating method as described with reference to FIG. 12(a). Therefore, it is possible to secure a sufficient thickness for the fixed contact electrodes 14. The micro switching device X1 as the above is suitable for lowering the insertion loss in the closed state.

According to the micro switching device X1, the bottom surface of the contact regions 14a in the fixed contact electrodes 14 (i.e. the surface which can make contact with the movable contact 13) is not a frontier surface where a layer of plated metal grows, and therefore is highly flat. Thus, it is possible to form an air gap between the movable contact 13 and the contact regions 14a at a high dimensional accuracy. The gap which has a high dimensional accuracy is suitable for lowering the insertion loss in the closed state and suitable for improving isolation characteristics in the open state.

According to the above step described with reference FIG. 13(a), even if the etchant happens to come into the bonding surface between the movable portion 12 and the protective film 32, the etchant cannot have crossed the groove 17 until the etchant has traveled all the way through the non-straight path along the inner surface of the groove 17 as well as the non-straight path along the surface of the protective film 32 which drops into the groove 17. Thus, in the above step described with reference FIG. 13(a), the groove 17 which is formed along the piezoelectric drive 15 and is covered by the protective film 32, and the protective film 32 which has its part covering down into the groove 17 constitute a structure that works to slow down the etchant which makes its way into the bonding surface between the movable portion 12 and the protective film 32 to approach or reach the piezoelectric drive 15. Therefore, the above-described method enables to perform the etching process described with reference to FIG. 13(a) while providing sufficient protection to the piezoelectric drive 15, and to manufacture the micro switching device X1 properly.

Figure 14:
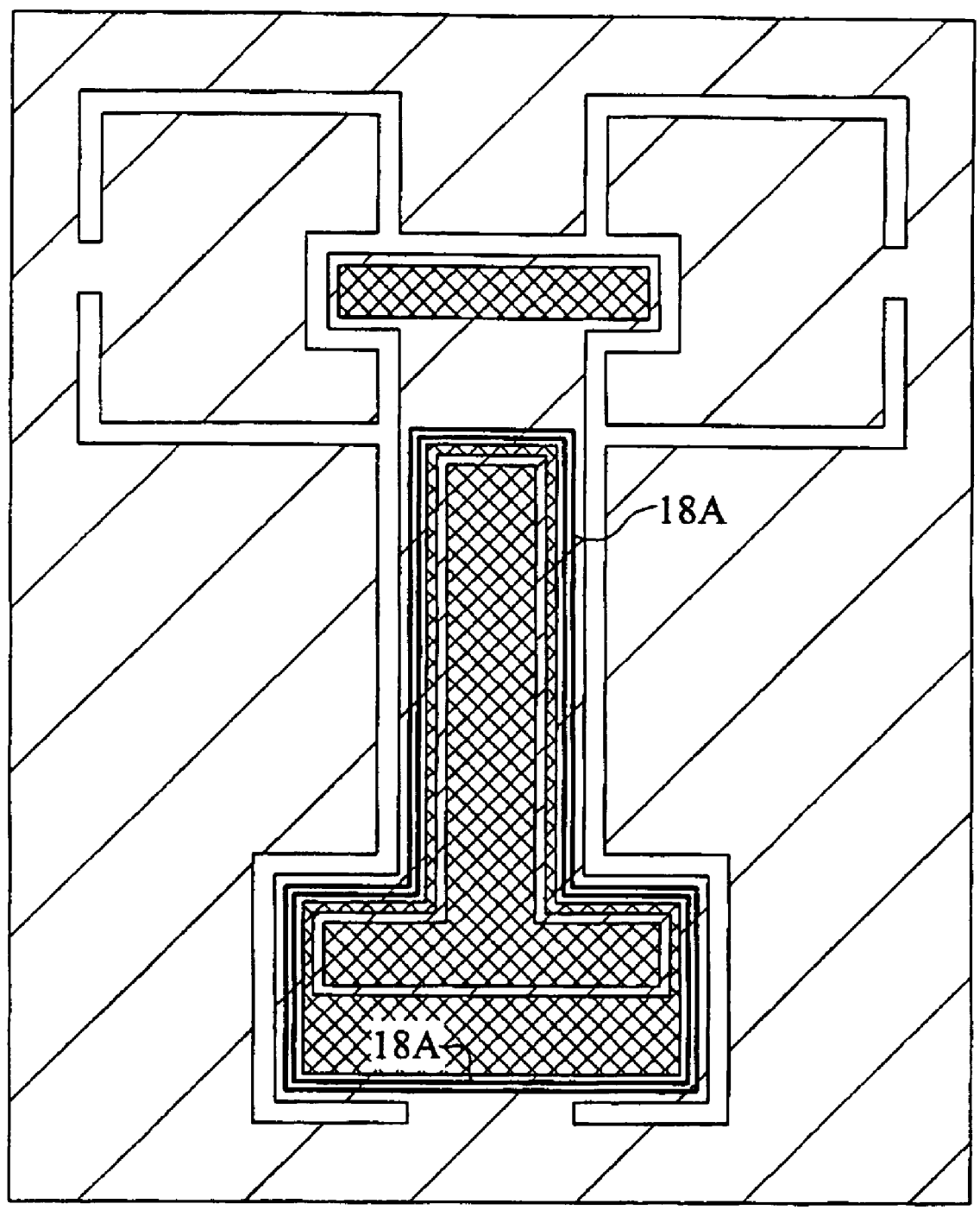
FIG. 14 is a partially non-illustrated plan view of a variation of the micro switching device in FIG. 1.
Figure 15:
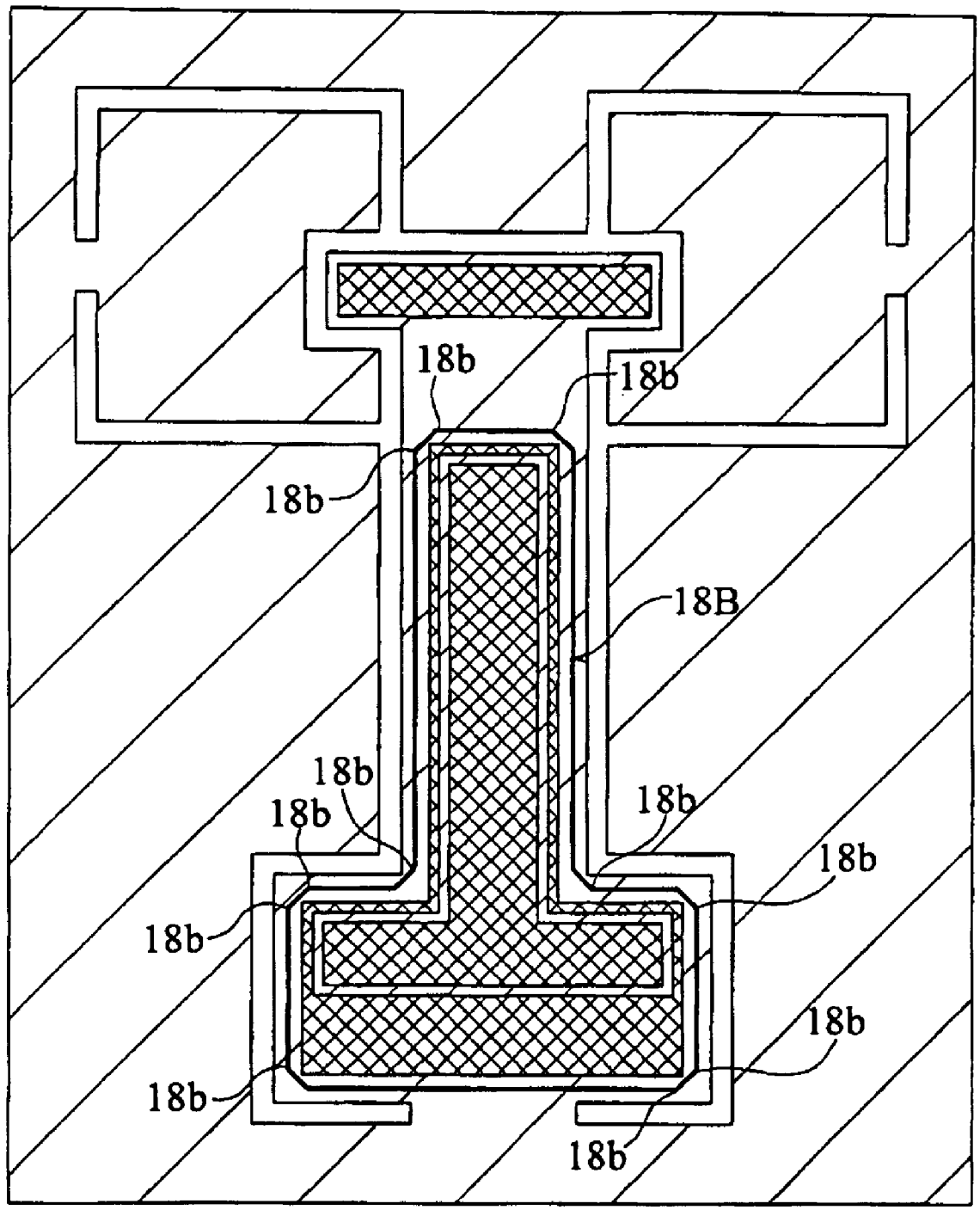
FIG. 15 is a partially non-illustrated plan view of another variation of the micro switching device in FIG. 1.
Figure 16:
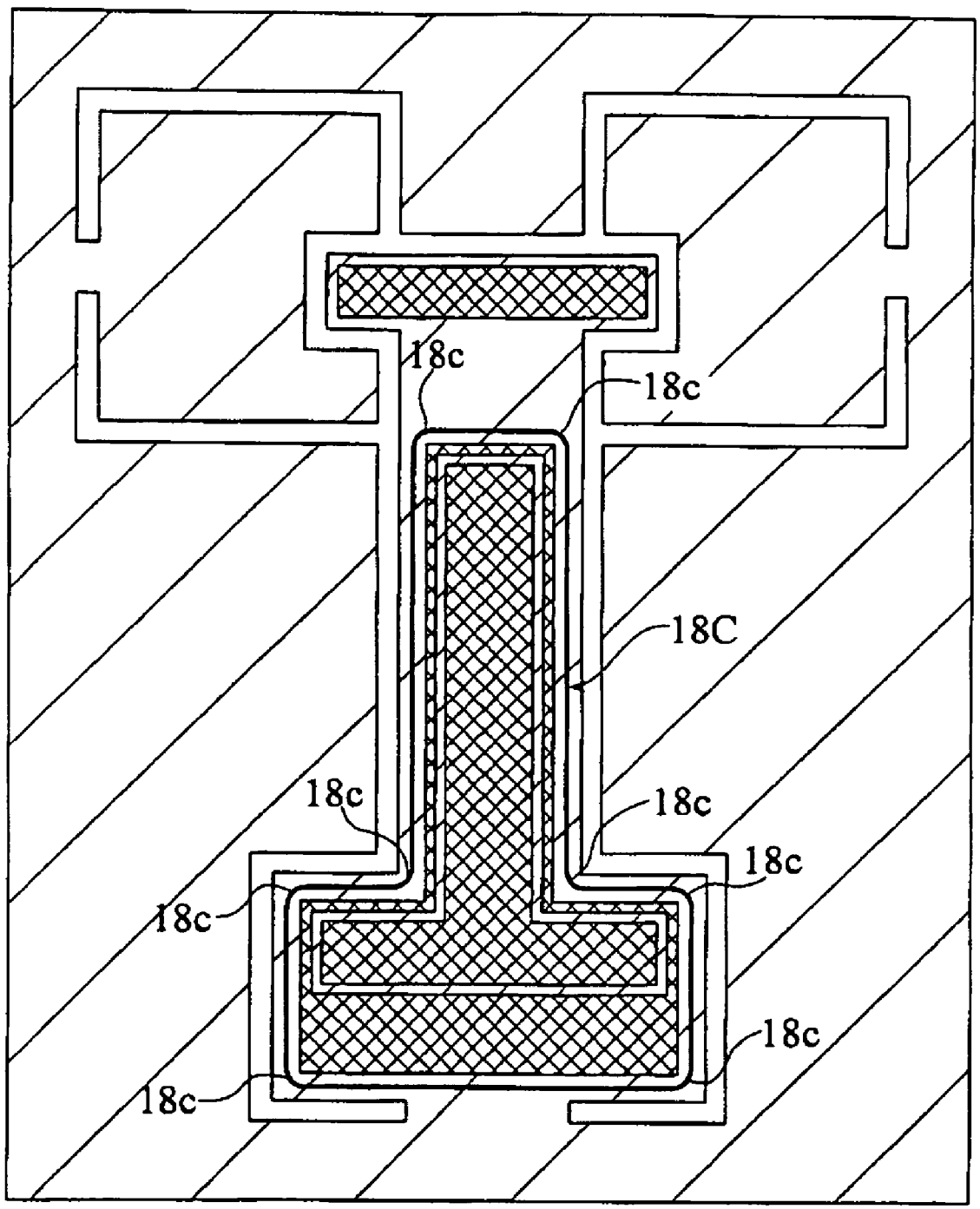
FIG. 16 is a partially non-illustrated plan view of another variation of the micro switching device in FIG. 1.

In the micro switching device X1, the groove 17 may be replaced by double grooves 18A as shown in FIG. 14, a groove 18B as shown in FIG. 15 or a groove 18C as shown in FIG. 16. Note that FIG. 14 through FIG. 16 show the respective grooves 18A, 18B and 18C in thick solid lines for the illustrative simplicity.

The double grooves 18A in FIG. 14 extend in parallel to each other along the piezoelectric drive 15. If the groove 18A is used in place of the groove 17, the step described earlier with reference to FIG. 17(b) is performed slightly differently: Specifically, instead of the resist pattern 31, a different resist pattern which has openings that correspond to the double grooves 18A is formed. In the step described earlier with reference to FIG. 8(a), this resist pattern is used as the mask when the first layer 21 is subjected to the anisotropic etching process in which the first layer 21 is etched to a midway of its thickness. In the step described earlier with reference to FIG. 8(b), the protective film 32 is formed to cover the piezoelectric drive 15 and the double grooves 18A. The double grooves 18A which are covered by the protective film 32 and the protective film 32 which has its part covering down into each of the grooves 18A constitute a structure which is superior to the structure that is provided by the groove 17 covered by the protective film 32 and the protective film 32 having its part covering down into the groove 17 in the ability to slow down the etchant which makes its way into the bonding surface between the movable portion 12 and the protective film 32 to approach or reach the piezoelectric drive 15.

The groove 18B in FIG. 15 has corners 18b whose inner angles (the angles facing the piezoelectric drive 15) are greater than 90°. If the groove 18B is used in place of the groove 17, the step described earlier with reference to FIG.

7(b) is performed slightly differently: Specifically, instead of the resist pattern 31, a different resist pattern which has the opening that corresponds to the groove 18B is formed. In the step described earlier with reference to FIG. 8(a), this resist pattern is used as the mask when the first layer 21 is subjected to the anisotropic etching process in which the first layer 21 is etched to a midway of its thickness. In the step described earlier with reference to FIG. 8(b), the protective film 32 is formed to cover the piezoelectric drive 15 and the double grooves 18B. It is already confirmed that the corners 18b whose inner angle is greater than 90° are superior to the 90° angle corner in the ability to slow down the etchant's crosscutting travel in the step described earlier with reference to FIG. 13(a).

The groove 18C in FIG. 16 has corners 18c where the groove curves to change its extending direction. If the groove 18C is used in place of the groove 17, the step described earlier with reference to FIG. 7(b) is performed slightly differently: Specifically, instead of the resist pattern 31, a different resist pattern which has the opening that corresponds to the groove 18C is formed. In the step described earlier with reference to FIG. 8(a), this resist pattern is used as the mask when the first layer 21 is subjected to the anisotropic etching process in which the first layer 21 is etched to a midway of its thickness. In the step described earlier with reference to FIG. 8(b), the protective film 32 is formed to cover the piezoelectric drive 15 and the double grooves 18C. It is already confirmed that the corners 18c where the groove curves to change its extending direction are superior to the corners in the groove 17 whose inner angle is 90°, in the ability to slow down the etchant's crosscutting travel in the step described earlier with reference to FIG. 13(a).

The invention claimed is:

1. A micro movable device comprising:
   a base substrate;
   a fixed portion bonded to the base substrate;
   an elongated movable portion having a fixed end fixed to the fixed portion and extending along the base substrate;
   a piezoelectric drive provided on the movable portion on a side away from the base substrate, the piezoelectric drive having a laminate structure provided by a first electrode film contacting the movable portion, a second electrode film and a piezoelectric film between the first and the second electrode films;
   a movable contact provided in the movable portion, on a side away from the base substrate; and
   a pair of fixed contact electrodes, each bonded to the fixed portion and having a portion facing the movable contact;
   wherein the movable portion is provided with a groove extending along the piezoelectric drive,
   wherein the groove extends only partially through the movable portion and includes an elongated part extending longitudinally of the movable portion.

2. The micro movable device according to claim 1, wherein the movable portion is provided with a plurality of grooves extending along the piezoelectric drive.

3. The micro movable device according to claim 1, wherein the groove is formed on the movable portion to surround the piezoelectric drive.

4. The micro movable device according to claim 1, wherein the groove includes a bent corner for directional change, the bent corner having an inner angle greater than 90 degrees.

5. The micro movable device according to claim 1, wherein the groove includes a curved corner for directional change.

6. The micro movable device according to claim 1, wherein the movable portion and the fixed portion are separated from each other by slits extending along the movable portion, the groove being formed on the movable portion inwardly from the slits.

* * * * *